United States Patent
Ho et al.

(10) Patent No.: US 11,435,670 B1
(45) Date of Patent: Sep. 6, 2022

(54) MULTI-COMPONENT KERNELS FOR VECTOR OPTICAL IMAGE SIMULATION

(71) Applicant: TAIWAN SEMICONDUCTOR MANUFACTURING CO., LTD., Hsinchu (TW)

(72) Inventors: Kenneth Lik Kin Ho, Redwood City, CA (US); Chien-Jen Lai, Hsinchu (TW); Kenji Yamazoe, Campbell, CA (US); Xin Zhou, San Jose, CA (US); Danping Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/187,351

(22) Filed: Feb. 26, 2021

(51) Int. Cl.
*G03F 7/20* (2006.01)

(52) U.S. Cl.
CPC .......... *G03F 7/70441* (2013.01); *G03F 7/705* (2013.01); *G03F 7/70025* (2013.01)

(58) Field of Classification Search
CPC ............ G03F 7/70025; G03F 7/70058; G03F 7/70083; G03F 7/70091–70116; G03F 7/70125; G03F 7/70141; G03F 7/70425–70441; G03F 7/70483–70541; G03F 1/22; G03F 1/24; G03F 1/36; G03F 1/68; G03F 1/70
USPC ........ 355/52–55, 67–71, 18, 77, 133; 430/5, 430/22, 30; 382/144, 145, 154; 716/51–56
See application file for complete search history.

(56) References Cited

U.S. PATENT DOCUMENTS

| | | | |
|---|---|---|---|
| 10,809,629 B2 | 10/2020 | Ho | |
| 11,256,176 B1* | 2/2022 | Ho | G03F 7/70025 |
| 2001/0046073 A1* | 11/2001 | Kathman | G02B 5/1857 |
| | | | 359/15 |
| 2004/0167748 A1* | 8/2004 | Zhang | G03F 7/705 |
| | | | 702/185 |
| 2006/0009957 A1* | 1/2006 | Kohle | G03F 7/705 |
| | | | 703/2 |
| 2007/0038973 A1* | 2/2007 | Li | G06F 30/39 |
| | | | 716/51 |
| 2010/0141925 A1* | 6/2010 | Cao | G03F 7/70666 |
| | | | 355/77 |
| 2017/0147734 A1* | 5/2017 | Rosenbluth | G03F 7/705 |
| 2017/0269470 A1* | 9/2017 | Lee | G06F 30/398 |
| 2020/0004135 A1* | 1/2020 | Huang | G06F 30/398 |

\* cited by examiner

*Primary Examiner* — Christina A Riddle
(74) *Attorney, Agent, or Firm* — McDermott Will & Emery LLP

(57) ABSTRACT

A method of enhancing a layout pattern includes determining a vector transmission cross coefficient (vector-TCC) operator of an optical system of a lithographic system based on an illumination source of the optical system and an exit pupil of the optical system of the lithographic system. The method also includes performing an optical proximity correction (OPC) operation of a layout pattern of a photo mask to generate an OPC corrected layout pattern. The OPC operation uses the vector-TCC operator to determine a projected pattern of the layout pattern of the photo mask on a wafer. The method includes producing the OPC corrected layout pattern on a mask blank to create a photo mask.

20 Claims, 15 Drawing Sheets

---

900

Determine a vector transmission cross coefficient (vector-TCC) operator of an optical system of a lithographic system based on an illumination source of the optical system and an exit pupil of the optical system of the lithographic system — S902

Perform an optical proximity correction (OPC) operation of a layout pattern of a photo mask using the vector-TCC operator to determine a projected image of the layout pattern of the photo mask on a wafer — S904

MULTI-COMPONENT KERNELS FOR VECTOR OPTICAL IMAGE SIMULATION

An optical lithography process transfers a layout pattern of a photo mask to the wafer such that etching, implantation, or other steps are applied only to predefined regions of the wafer. Transferring the layout pattern of the photo mask to the resist layer on the wafer may cause resist pattern defects that are a major challenge in semiconductor manufacturing. An optical proximity correction (OPC) operation may be applied to the layout pattern of the photo mask to reduce resist pattern defects. The OPC may modify the layout patterns of the photo mask before the lithography process to compensate for the effect of the lithography process. In addition, inverse lithographic transformation (ILT) may be performed on the layout patterns of the photo mask to further compensate for the effect of the lithography process. An accurate OPC or ILT operation on the layout patterns of the photo masks is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
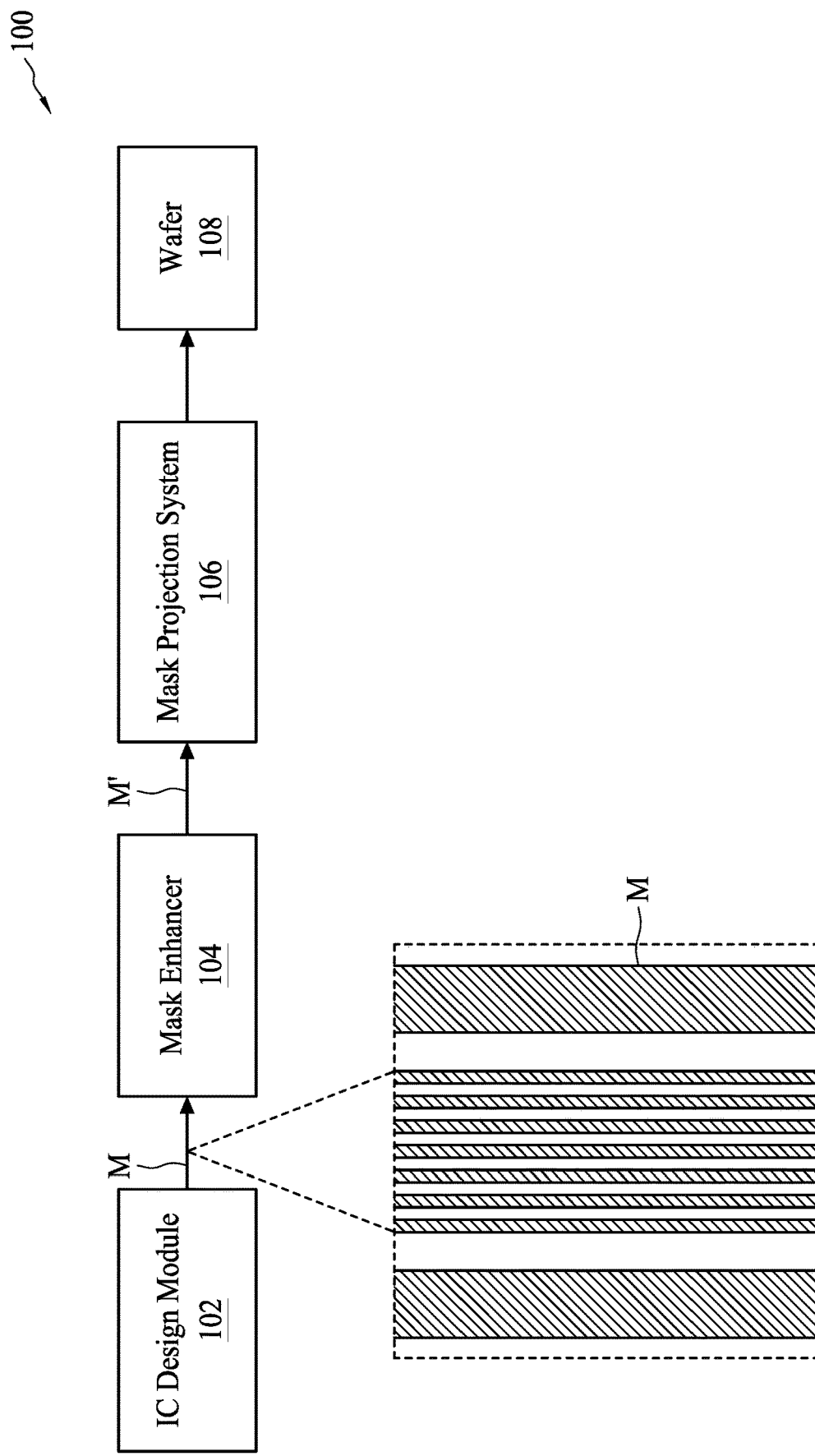
FIG. 1 illustrates a schematic diagram of an exemplary integrated circuit (IC) fabrication flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, one or both of the OPC operation or the ILT operation is applied to the layout pattern of the photo mask to reduce resist pattern defects. In some embodiments, both OPC and ILT operations are iteratively performed. The OPC and the ILT modify a layout pattern of the photo mask, the modified layout pattern of the photo mask is projected, by an optical system of a lithographic system, as a pattern on the resist material layer on a wafer. The projected pattern on the resist material is compared with a target layout pattern and an error between the projected pattern on the resist material and the target layout pattern is calculated. Depending on the calculated error and/or existence of some defects, e.g., a bridge or a narrowing, the layout pattern of the photo mask is further modified by the OPC and/or ILT operations. The iterative method is repeatedly applied until the defects are corrected or the calculated error is below a threshold level. In some embodiments, the projection of the layout pattern of the photo mask on the resist layer of a wafer is performed by a simulated projection and the projected pattern on the resist layer of the wafer is determined. In the simulated projection, an image formation theory, e.g., Abbe's theory or Hopkins' theory, is used for calculating the projected pattern of the photo mask on the wafer. In some embodiments, the illumination source, e.g., light source or laser source, of the optical system of the lithographic system is sampled by a sampling grid and the simulated projection is numerically calculated. In some embodiments, a TCC operator, e.g., a TCC matrix, based on Hopkins' theory, is pre-calculated. The TCC matrix depends on the exit pupil and the illumination source of the optical system of the lithographic system and is calculated before the application of the OPC or ILT operation. As shown below, the TCC matrix and the layout pattern of the photo mask are used for determining the projected mask on the wafer.

In some embodiments, a scalar theory is used for image formation. In the scalar theory of image formation, the electrical and magnetic components of the illumination light are independently treated starting from the illumination source, e.g., the light source, to the transmission of the illumination light between the illumination source and the wafer, and to the projected pattern on the wafer. In some embodiments, the illumination light travels in the Z-direction and the electrical and magnetic fields of the illumination light are in the XY-plane that is perpendicular to the Z-direction. Thus, the electrical and magnetic fields of the illumination light have components in the X-direction and Y-direction.

In the scalar theory of the image formation, the calculations are performed for one of the electrical and magnetic components of the illumination light. Also, in the scalar theory of the image formation, the calculations may be performed for a complex amplitude, e.g., a real amplitude and phase, of the electrical or magnetic component of the illumination light and, thus, the light intensity is the real amplitude squared. Alternatively, a vector theory may be used for image formation and the Abbe's theory, the Hopkins' theory, or the TCC matrix may be calculated, without approximation, in vector form such that the electrical or magnetic components of the illumination source are treated as vectors. In some embodiments, the scalar theory is a good approximation when the size of the illumination source and the exit pupil are not comparable to the wavelength of the illumination light. In some embodiments, the scalar theory is a good approximation when the numerical aperture (NA) of the optical system of the lithographic system is less than 0.5. Therefore, it is desirable to use the vector theory of image formation to get a more accurate result during the application of the OPC or ILT operation. In some embodiments, generating components, matrices, and operators in vector form includes adding extra elements to the components, matrices, and operators to provide means, e.g., degrees of freedom, for incorporating the effects of the components of the electrical or magnetic vectors and the polarization of the illumination source.

FIG. 1 illustrates a schematic diagram of an exemplary integrated circuit (IC) fabrication flow 100. The IC fabrication flow 100 begins with an IC design module 102 that provides layout patterns M, e.g., target layout patterns, that will be produced as a resist pattern of an IC product on the wafer. The IC design module 102 generates various layout shapes, e.g., geometrical patterns, based on the specification of the IC product for different steps of processing the IC product. In some embodiments, the layout patterns M are presented by one or more data files having the information of the geometrical patterns. In some embodiments, optically projecting the layout pattern of the photo mask to the wafer in the lithographic process degrades the layout pattern of the photo mask and generates pattern defects on the resist layer on the wafer. An optical proximity correction (OPC) operation may be applied to layout patterns of the photo mask to reduce pattern defects on the wafer. The OPC may modify the layout patterns of the photo mask before the lithography process to compensate for the effect of the lithography and/or etching processes. The IC fabrication flow 100 also shows a mask enhancer 104. As will be described in more detail below with respect to FIG. 2A, the mask enhancer 104 performs the OPC in some embodiments. The mask enhancer 104 creates an OPCed (e.g., a corrected or enhanced) layout pattern M' on the photo mask. In some embodiments, the enhanced layout pattern M' is presented by one or more data files having the information of the enhanced geometrical patterns.

The IC fabrication flow 100 further shows a mask projection system 106. In some embodiments, the mask projection system 106 produces the enhanced layout patterns M' on the photo mask. In some embodiments, the mask projection system 106 performs two functions. As a first function, the mask projection system 106 uses the data files of the enhanced layout pattern M' and uses an electron beam to generate the enhanced layout pattern M' on a mask blank (not shown) to produce the photo mask for the ICs. In addition, and as a second function, the mask projection system 106 optically projects the enhanced layout pattern M' of the photo mask on the wafer 108 to produce the IC layouts on the wafer 108.

Figure 2A:
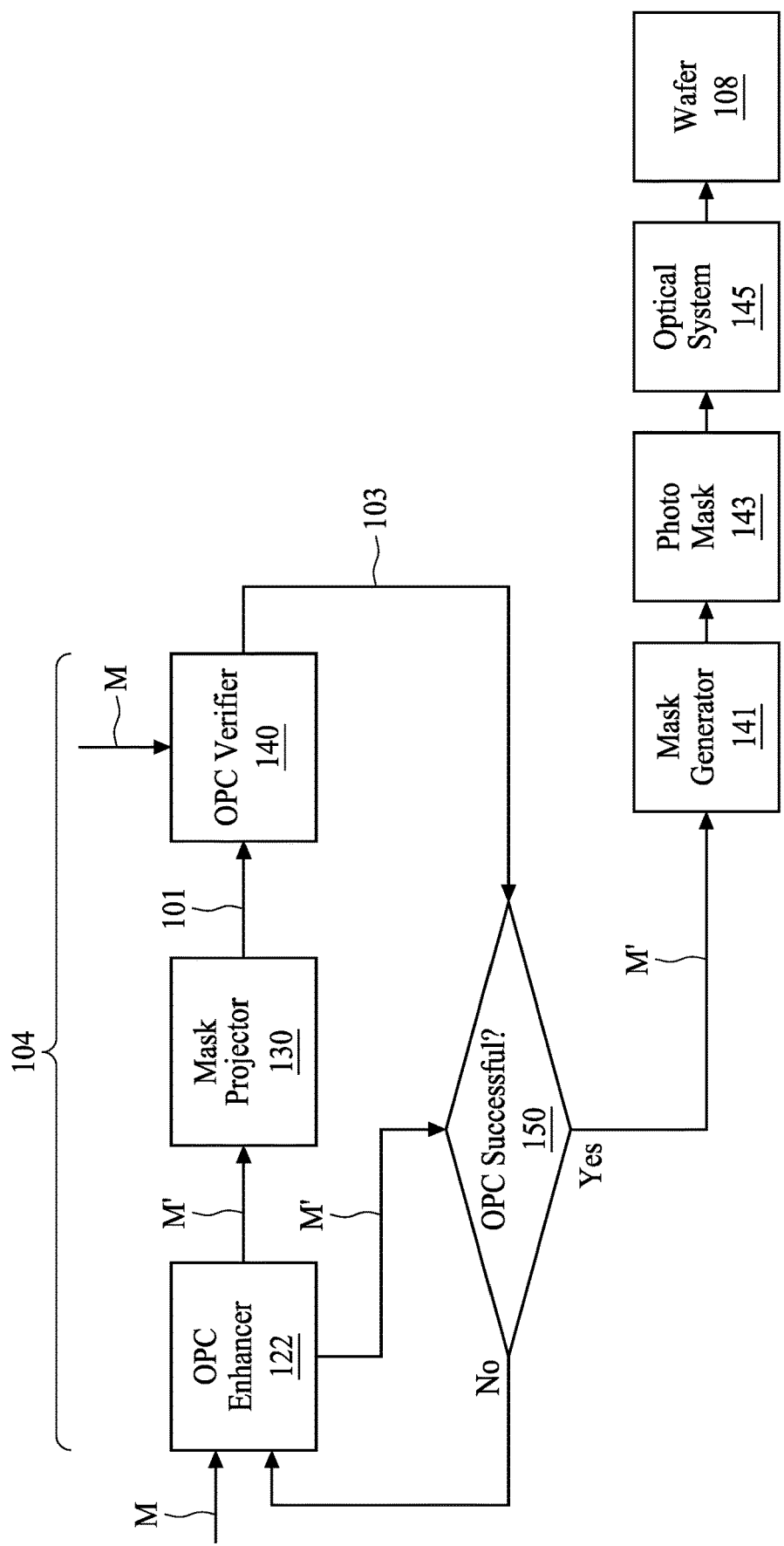
FIGS. 2A and 2B illustrate a schematic diagram of an exemplary photo mask enhancer and an OPC enhanced layout pattern associated with a target layout pattern.
Figure 2B:

FIGS. 2A and 2B illustrate a schematic diagram of an exemplary photo mask enhancer and an OPC enhanced layout pattern associated with a target layout pattern. FIG. 2A illustrates a schematic diagram of the mask enhancer 104 that receives the target layout pattern M at an input of an OPC enhancer 122 and produces the enhanced layout pattern M' at an output of step 150. The mask enhancer 104 performs an iterative process. In some embodiments, the mask enhancer 104 includes an OPC enhancer 122 that receives, from the IC design module 102, the target layout pattern M that will be produced on the wafer 108. The OPC enhancer 122 performs enhancements on the target layout pattern M and produces the OPCed (e.g., the corrected or enhanced) layout pattern M'. As described, OPC is a lithography technique that is used to correct or enhance the layout pattern M and to add improved imaging effects to a target layout pattern M such that the OPCed layout pattern M' reproduces, on the wafer 108, the target layout pattern M. For example, OPC is used to compensate for imaging distortions due to optical diffraction. In some embodiments, the target layout pattern M is a data file having the information of the geometrical patterns to be produced on the wafer 108, and the OPC enhancer 122 modifies the data file and produces a corrected data file representing the enhanced layout pattern M'. In some embodiments, the target layout pattern M and the enhanced layout pattern M' are represented by the vertices of the layout patterns in the data files. Thus, in some embodiments, the rounded corners and the bends are represented by a curvilinear shape having multiple vertices and multiple line segments connecting the vertices and the curvilinear shape are represented by the multiple vertices in the data file.

FIG. 2A further shows a mask projector 130, e.g., a simulator for mask projection, that is applied to the enhanced layout pattern M' to produce a projected resist pattern 101 on the wafer. In some embodiments, the enhanced layout pattern M' is a data file and the optical simulator 130 simulates the projection of the enhanced layout pattern M' on the wafer and produces the simulated projected resist pattern 101. The projected resist pattern 101 is inspected by an OPC verifier 140 for errors. In some embodiments, the OPC verifier 140 receives the target layout pattern M in addition to the projected resist pattern 101 and compares the projected resist pattern 101 with the target layout pattern M to find errors between target layout pattern M and the projected resist pattern 101. In some embodiments, the OPC verifier 140 verifies the enhanced, e.g., OPCed, layout pattern M' when the error between the target layout pattern M and the projected resist pattern 101 is below a threshold level and there are no defects, e.g., a bridge or narrowing shown in FIG. 3, in the projected resist pattern. In some embodiments, after verifying the enhanced layout pattern M', the OPC verifier 140 generates and sends a verification signal 103. In some embodiments, the OPC verifier 140 stores the enhanced layout pattern M' in a database. In some embodiments, instead of a simulated result, a photo resist pattern is formed by using a photo mask fabricated with the enhanced layout pattern M' and the shapes and dimensions of the resist patterns are measured and are fed back to the OPC enhancer.

The verification signal 103 is tested at step 150 and if the verification signal 103 is not successful, e.g., the error is above the threshold level or defects exist in the projected resist pattern 101, iterations continue by applying further OPC enhancements by the OPC enhancer 122. The iterations continue until the verification signal 103 is successful. When the verification signal 103 is successful, the enhanced layout pattern M' is provided as the output of the mask enhancer 104. In some embodiments, the error between the target layout pattern M and the projected resist pattern 101 is defined as a distance between the boundary of the target layout pattern M and a boundary of the projected resist pattern 101.

As shown, in addition to the mask enhancer 104, FIG. 2A includes a mask generator 141 and an optical system 145. In some embodiments, the enhanced layout pattern M' is sent as a data file to the mask generator 141. The mask generator 141 produces the enhanced layout pattern M' on a mask blank to generate a photo mask 143. In some embodiments, the photo mask 143 is used by the optical system 145 of a photo lithography system to produce a resist pattern on a resist layer of the wafer 108.

FIG. 2B illustrates the target layout patterns 303 and the OPC enhanced, e.g., corrected, layout patterns 301 of a connection line. In some embodiments, the OPC enhanced layout patterns 301 of FIG. 2B is formed on a photo mask and the photo mask is projected onto a wafer, e.g., the wafer 108, by the mask projection system 106 of FIG. 1.

Figure 3:
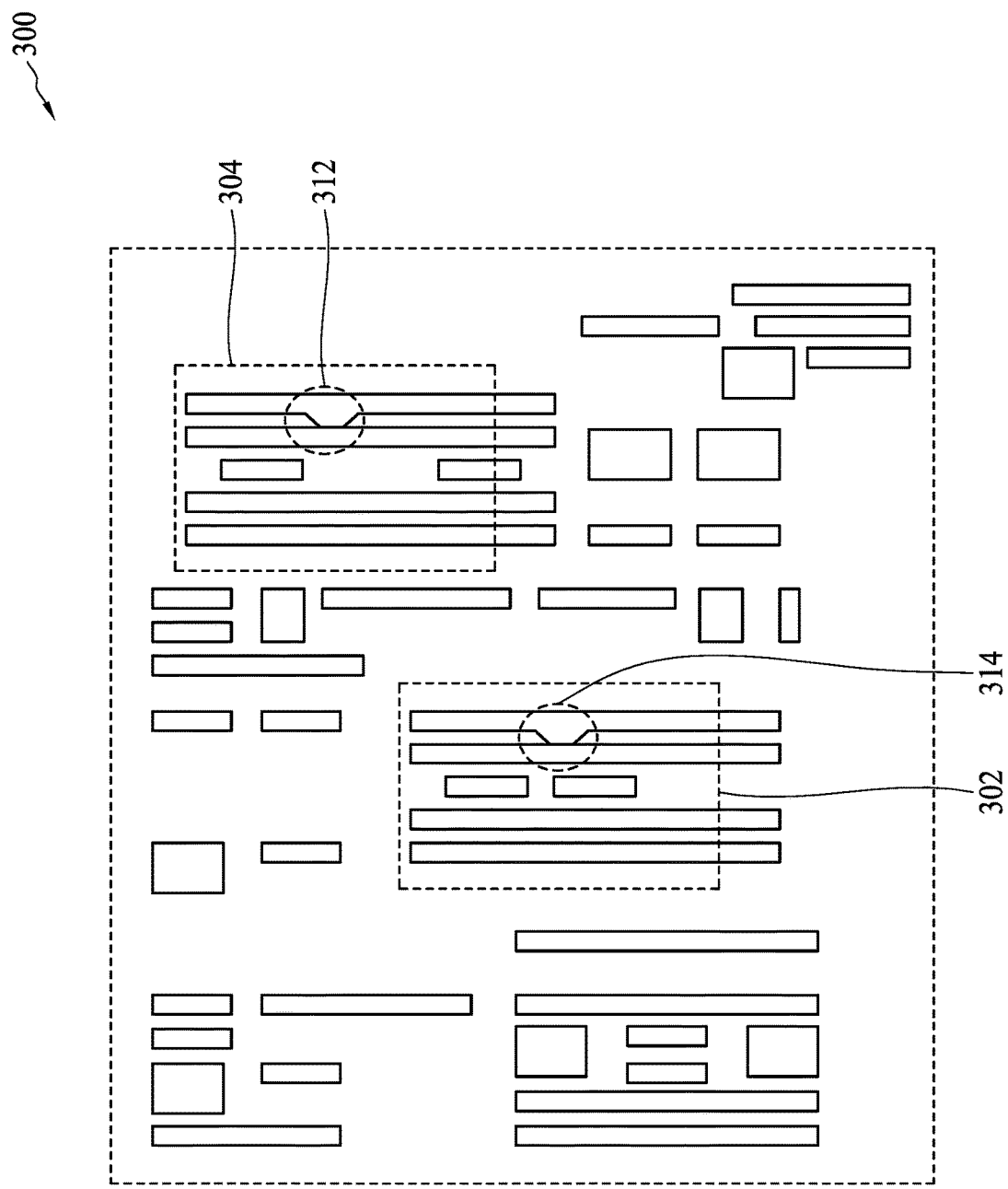
FIG. 3 illustrates exemplary layout contours having two defective areas.

FIG. 3 illustrates exemplary layout contours having two defective areas. FIG. 3 shows the resist pattern 300 having two defective areas 302 and 304. The resist pattern 300 may be produced by the mask projector 130 when the corrected mask layout M', after being OPCed, is projected on the resist layer of the wafer 108, disclosed herein. As shown, both of the defective areas 302, 304 respectively include a bridging 312 and a bridging 314 (e.g., short circuits) that are connections between adjacent layout lines in the middle of the defective areas 302 and 304. In some embodiments, the defective areas 302 and 304 are back projected to two corresponding hotspot regions in the corrected mask layout M'. In some embodiments, the ILT operation is performed on the corrected mask layout M', e.g., on the hotspot regions in the corrected mask layout M', to correct the corresponding defective areas 302 and 304 of the resist pattern produced in the resist layer of the wafer 108.

Figure 4:
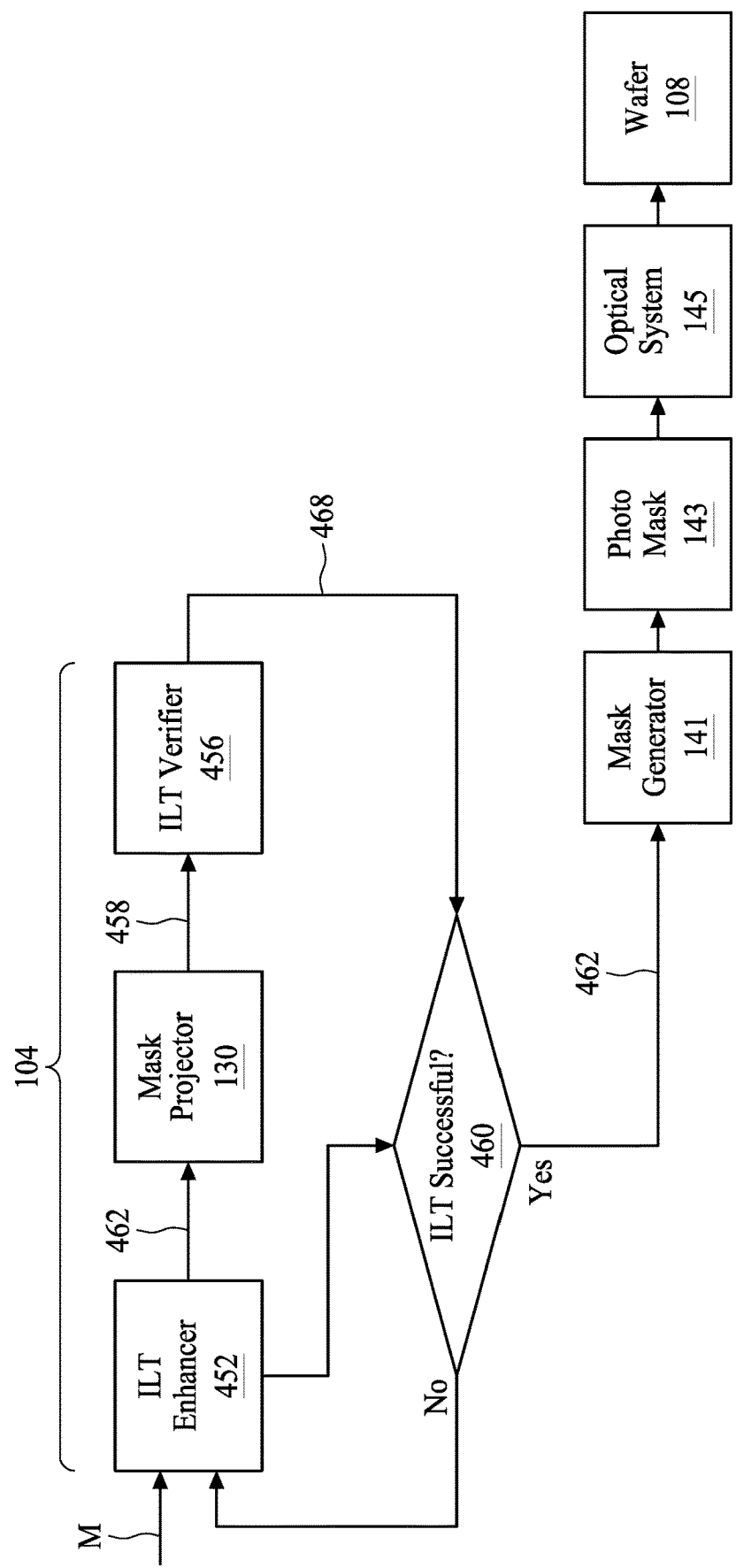
FIG. 4 illustrates a schematic diagram of an exemplary layout corrector.

FIG. 4 illustrates a schematic diagram of an exemplary layout corrector. FIG. 4 is configured to perform an ILT enhancement. FIG. 4 shows the mask enhancer 104 that receives the target layout pattern M at an input of an ILT enhancer 452 and produces an enhanced mask layout 462 at an output of the step 460. In some embodiments, the ILT enhancer 452 receives the corrected mask layout M' after the OPC operation. Either the corrected mask layout M' or the target layout pattern M includes a hotspot region corresponding to a defect on the resist layer when the corrected mask layout M' or the target layout pattern M is projected on the resist layer of the wafer 108.

The ILT enhancer 452 performs an enhancement, e.g., a constrained inverse filtering operation, on the hotspot region of the corrected mask layout M' or the target layout pattern M and produces the iteration result, the enhanced mask layout 462. The enhanced mask layout 462 is projected by the mask projector 130 on the resist layer of the wafer 108 to create a projected resist pattern 458. In some embodiments, the mask projector 130 performs a simulated projection and is consistent with the operation performed by the configuration of FIG. 7. The projected resist pattern 458 is inspected by an ILT verifier 456 for defective areas. A verification outcome 468 is tested at step 460 and if the verification outcome 468 is not successful, e.g., defective areas exist, the iterations continue by modifying the layout enhancement at the ILT enhancer 452. The iterations continue until the verification outcome 468 is successful and the projected resist pattern 458 does not have any defective areas. When the verification outcome 468 is successful, the enhanced mask layout 462 is provided at step 460.

As shown, in addition to the mask enhancer 104, FIG. 4 includes the mask generator 141 and an optical system 145. A described above, the mask generator 141 generates the photo mask 143 from the enhanced mask layout 462 and the optical system 145 of the photo lithography system projects the photo mask 143 layout pattern and produces the resist pattern on the resist layer of the wafer 108.

Figure 5A:
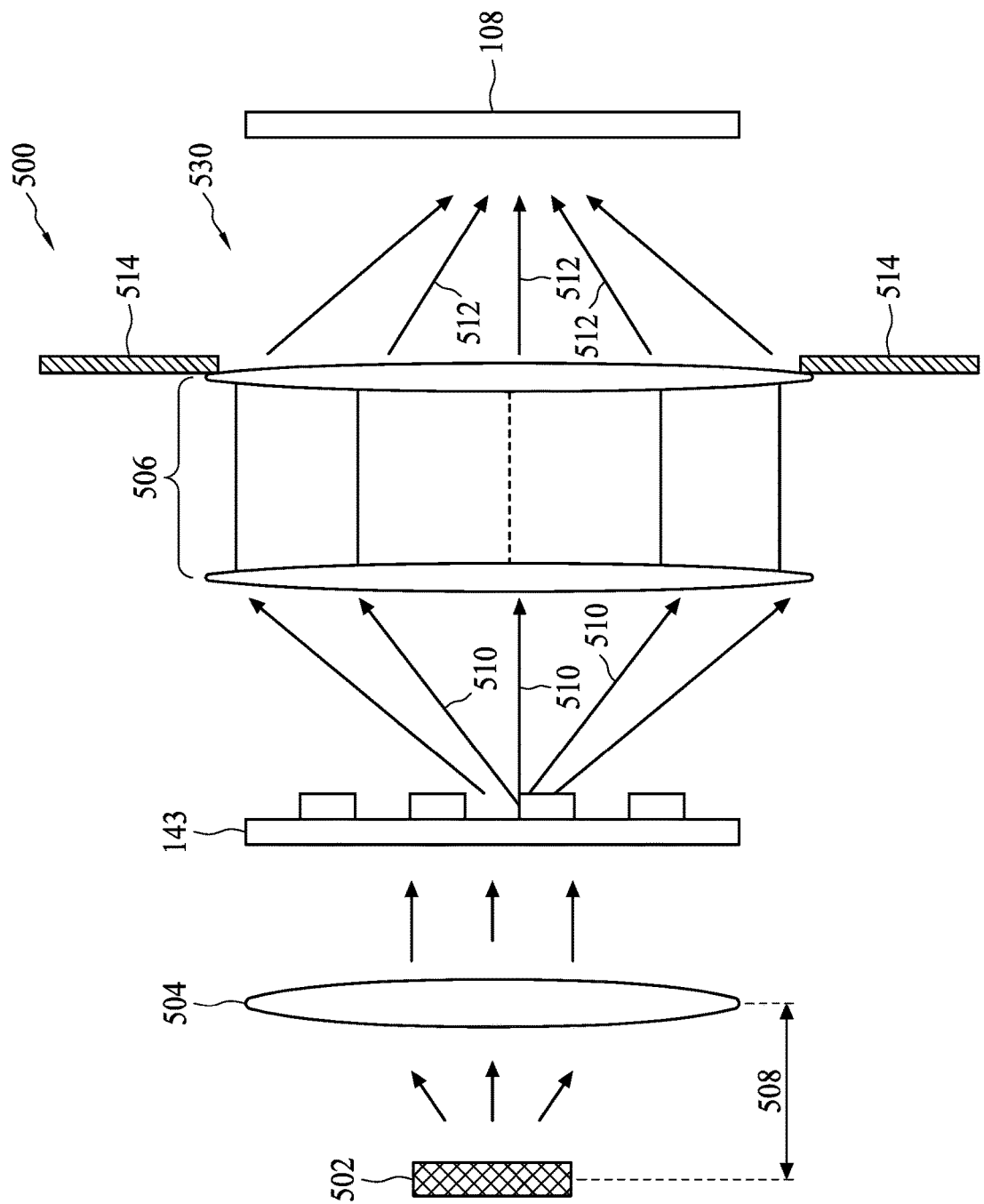
FIGS. 5A and 5B illustrate schematic diagrams of exemplary optical systems of a lithographic system.
Figure 5B:
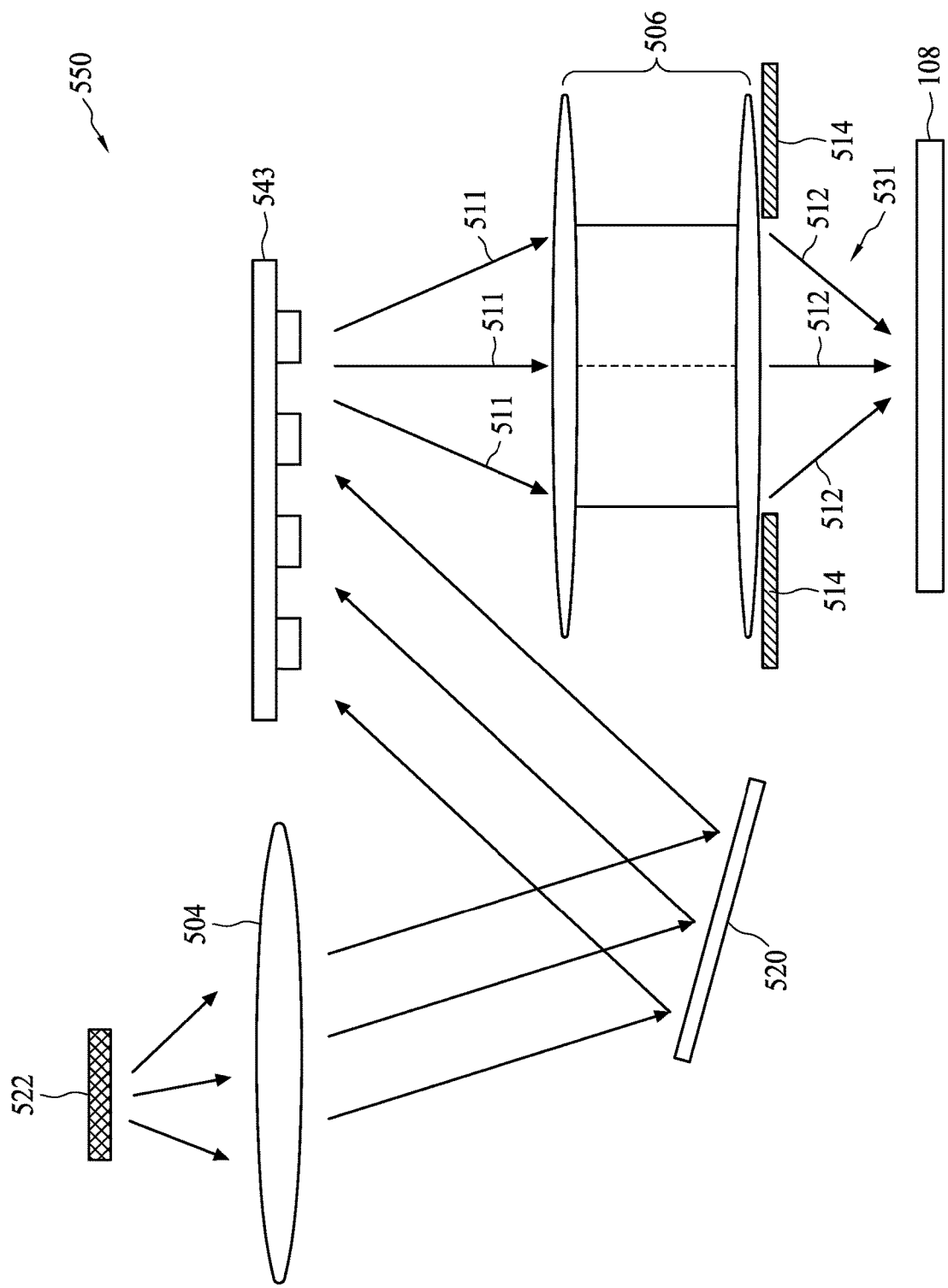

FIGS. 5A and 5B illustrate schematic diagrams of exemplary optical systems of an optical system of a lithographic system. FIG. 5A shows an optical system 500 that is used in a lithographic system in some embodiments. The optical system 500 shows an illumination source 502 at a distance 508 from a lens 504. The lens 504 transmits a radiation beam of the light source through the photo mask 143. The transmitted radiation beam 510 converges using an objective lens system 506 to generate the convergent beam 512 and to create a projected pattern of the photo mask 143 layout pattern on the wafer 108. As shown, blades 514 block any radiation that is outside an exit pupil 530 of the optical system 500. FIG. 5B shows an optical system 550 that is used in a lithographic system in some embodiments. The optical system 550 shows the illumination source 522. The lens 504 transmits a radiation beam of the illumination source 522. The radiation beam is reflected by a mirror 520 and is directed towards a mask 543, e.g., a reflective mask, and produces the reflected radiation beam 511 that is reflected off the mask 543. The reflected radiation beam 511 converges using the objective lens system 506 to generate a convergent beam 512 and to create a projected pattern of the reflected mask 543 on the wafer 108. FIG. 5B also shows the exit pupil 531 of the optical system 550. In some embodiments, the illumination source 502 or 522, e.g., the light source or the input source, is a deep ultraviolet (DUV) with a wavelength of about 250 nm to about 100 nm, or an extreme ultraviolet (EUV) source with a wavelength of about 100 nm to about 10 nm.

Figure 6:
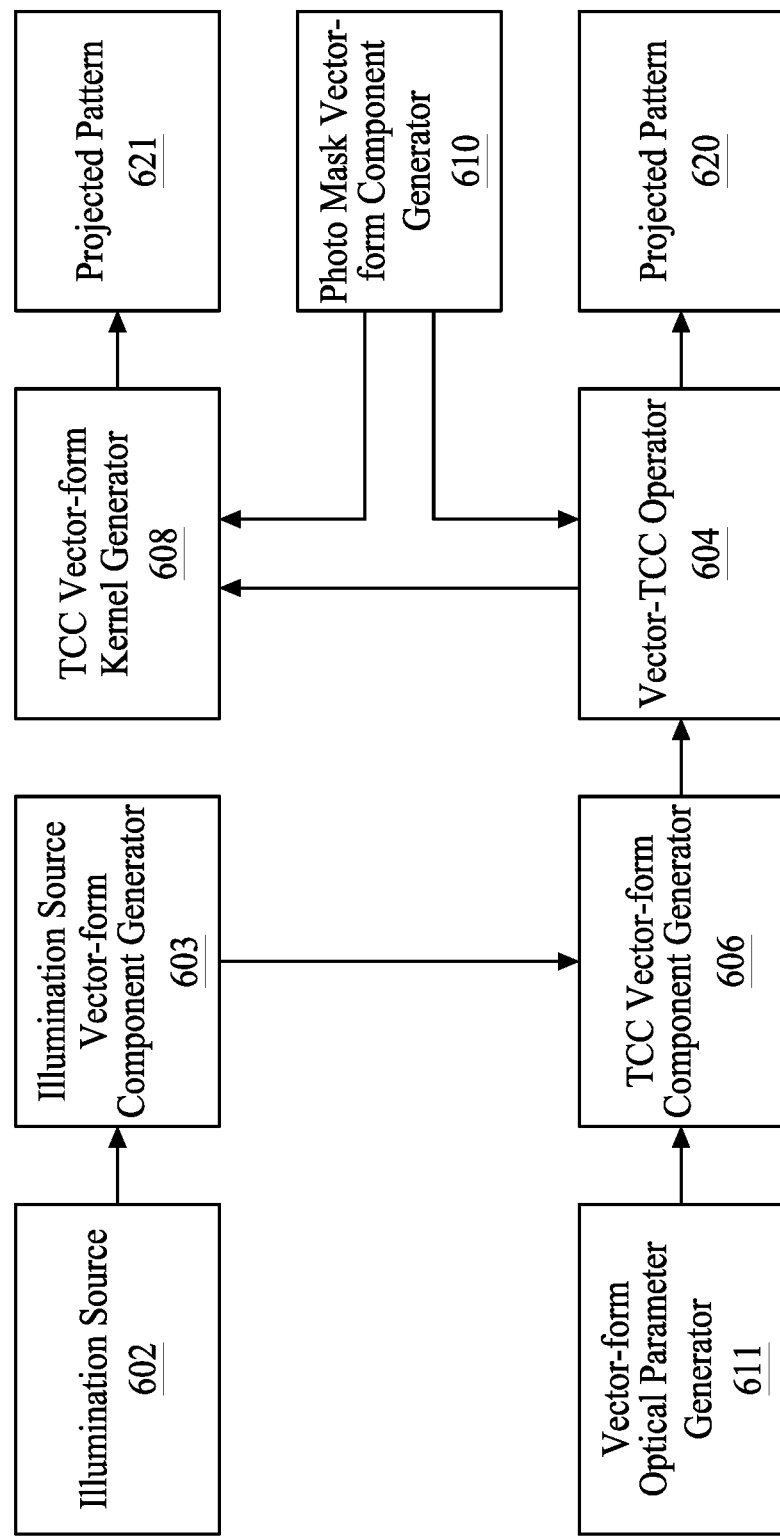
FIG. 6 illustrates a schematic diagram of an exemplary system for determining a transmission cross-coefficient (TCC) operator and determining a projected pattern of a photo mask on a wafer.

FIG. 6 illustrates a schematic diagram of an exemplary system for determining a transmission cross-coefficient (TCC) operator and determining a projected pattern of a photo mask on a wafer. FIG. 6 shows the illumination source 602, which is consistent with the illumination sources 502 and 522 of FIGS. 5A and 5B. An illumination source vector-form component generator 603 of FIG. 6 receives the information of the illumination source 602, e.g., an amplitude profile or an intensity profile of the illumination source 602, and generates vector components of the illumination source. In some embodiments, the illumination source 602 is sampled with a sampling grid and at each sampling point a vector, with magnitude and direction, is assigned to the electric or magnetic field of the light beam and direction of travel of the light beam from the sampled point of the illumination source 602. In some embodiments, the illumination source 602 is a laser source. In some embodiments, the input source 602 has a Gaussian profile with a standard deviation between about 0.5 cm and about 5 cm. In some embodiments, the input source 602 has a circular profile having a radius between about 0.5 cm and about 5 cm and having a uniform amplitude. In some embodiments, the illumination source 602 is one of a coherent or partially coherent source. In some embodiments, the illumination source 602 is a non-coherent source. In some embodiments, the illumination source vector-form component generator 603 of FIG. 6 receives a Fourier transform of the intensity profile of the illumination source 602. In some embodiments, the light at each point of the illumination source 602 travels in the Z-direction and, thus, the electrical or magnetic fields of the light are in the XY-plane, perpendicular to the Z-direction, and may be represented by components in the X-direction and Y-direction. In some embodiments, the illumination source 602 is a polarized illumination source having an electrical or magnetic field component in the X-direction and having another electrical or magnetic field component in the Y-direction. Similarly, the intensity profile of the illumination source 602 has two components, a first intensity profile associated with the electrical or magnetic field component in the X-direction, and a second intensity profile associated with the electrical or magnetic field component in the Y-direction. Accordingly, the spatial Fourier transform S of the intensity profile of the illumination source 602 includes the spatial Fourier transform of the first intensity profile and the spatial Fourier transform of the second intensity profile. Therefore, the spatial Fourier transform S of the intensity profile of the illumination source 602 at each point in the spatial frequency domain, e.g., at each two-dimensional (2D) spatial frequency ($\alpha_s=F_x$, $F_y$) is represented by a matrix having more than one element, e.g., is represented by a 2-by-2 matrix, shown in equation (1) below. As shown, $S_{xx}$ is the spatial Fourier transform of the first intensity profile at frequency $\alpha_s$ and $S_{yy}$ is the spatial Fourier transform of the second intensity profile at frequency $\alpha_s$.

$$S_{2\times 2}(\alpha_s) = \begin{bmatrix} S_{xx} & 0 \\ 0 & S_{yy} \end{bmatrix} \quad \text{Equation (1)}$$

In some embodiments, the polarization of the illumination source 602 continuously change with time and, thus, instead of the temporal values of the X-direction and Y-direction components of the illumination source 602, a time-averaged variance of the electrical or magnetic fields in the X-direction ($s_{xx}$), a time-averaged variance of the electrical or magnetic fields in the Y-direction ($s_{yy}$), and a time-averaged covariance between the electrical or magnetic fields in the X-direction and Y-direction ($s_{xy}$ or $s_{yx}$) are used. In some embodiments, the matrix elements of equation (2) are the spatial Fourier transform of the above variance functions and the covariance function at a spatial frequency $\alpha_s$.

$$S_{2\times 2}(\alpha_s) = \begin{bmatrix} S_{xx} & S_{xy} \\ S_{yx} & S_{yy} \end{bmatrix} \quad \text{Equation (2)}$$

In some embodiments, for un-polarized light, $S_{xx}=\frac{1}{2}$, $S_{yy}=\frac{1}{2}$, $S_{xy}=0$, and $S_{yx}=0$. In some embodiments, for x-polarized light, $S_{xx}=1$, $S_{yy}=0$, $S_{xy}=0$, and $S_{yx}=0$. In some embodiments, for a partially polarized light with degree of polarization D, $S_{xx}=$ $$\frac{1}{2}\big((1+D)\sin^2\theta + (1-D)\cos^2\theta\big), S_{yy} = 1 - S_{xx},$$

$$S_{xy} = -D\sin\theta\cos\theta, \text{ and } S_{yx} = S_{xy},$$

where θ is the angle between polar components in the spatial frequency $\alpha_s$.

In some embodiments, a vector form of radiation transmission between the illumination source 602 and a wafer, e.g., the wafer 108 of FIGS. 1, 2A, and 4, incorporates the effect of different polarization components of the electrical or magnetic field on each other and includes the polarization components of the illumination source. Thus, the elements of the matrix of the spatial Fourier transform of the intensity profile of the illumination source 602 incorporates the polarization components of the electric or magnetic field of the illumination source 602 in some embodiments as shown in equations (1) or (2). The effect of different polarization components are considered when transmitting between an input source, e.g., the illumination source 602 and a wafer, e.g., the wafer 108, when interacting with a layout pattern, e.g., the layout pattern of the photo mask 143, and when interacting with an exit pupil of an optical system, e.g., the exit pupil 530 and 531 of the optical systems 500 and 550.

FIG. 6 shows a vector-form optical parameter generator 611 that may model and determine, e.g., generate, the optical parameters of the optical system, e.g., the optical systems 500 and 550. In some embodiments, the optical parameters include the light transmission parameters including the aberrations and the exit pupil of the optical system, e.g., the exit pupils 530 and 531 of the optical systems 500 and 550. As shown in FIG. 6, a TCC vector-form component generator 606 receives vector-form components of the illumination source 602 and vector-form optical parameters from the vector-form optical parameter generator 611 and generates a vector-TCC operator 604. In some embodiments, the exit pupil function P, in vector form, at each point α in the spatial frequency domain is represented by a matrix having more than one element, e.g., is represented by a 3-by-2 matrix (shown in equation (3)) to incorporate the effect of the exit pupil, e.g., the exit pupil 530 of FIG. 5A, on the polarization components of the electric or magnetic field when transmitting through the exit pupil. As described, the light travels in the Z-direction and, thus, the electrical or magnetic fields of the light are in the XY-plane and are represented by components in the X-direction and Y-direction. The exit pupil function P at each point α of the spatial frequency is represented by the 3-by-2 matrix $P_{3\times 2}(\alpha)$ of equation (3). At each spatial frequency α, $P_{xx}$ and $P_{yy}$ respectively show the effect of the exit pupil function P, as a multiplication factor, on the components in the X-direction and Y-direction. $P_{yx}$ shows the effect of the exit pupil function P, as a multiplication factor, on the X-direction components that produce a Y-direction component. $P_{xy}$ shows the effect of the exit pupil function P, as a multiplication factor, on the Y-direction components that produce an X-direction component. $P_{zx}$ shows the effect of the exit pupil function P, as a multiplication factor, on the X-direction components that produce a Z-direction component. $P_{zy}$ shows the effect of the exit pupil function P, as a multiplication factor, on the Y-direction components that produce a Z-direction component.

$$P_{3\times 2}(\alpha) = \begin{bmatrix} P_{xx} & P_{xy} \\ P_{yx} & P_{yy} \\ P_{zx} & P_{zy} \end{bmatrix} \quad \text{Equation (3)}$$

In some embodiments, the elements of the exit pupil function P, e.g., the elements of the matrix $P_{3\times 2}(\alpha)$ are real valued. In some embodiments, one or more elements of the matrix $P_{3\times 2}(\alpha)$ are complex valued and, thus, incorporates the optical aberrations of the optical systems 500 and 550. In some embodiments, $P_{xx}=1$ and $P_{yy}=1$ and the other elements of the matrix $P_{3\times 2}(\alpha)$ are zero. In some embodiments, the exit pupil function P includes scalar multipliers for incorporating effects of cutoff (e.g., Gaussian or top hat), defocus, radiometric correction, aberrations, etc. In some embodiments, the edges of the exit pupil function P have more profound effects that cause conversion between polarization directions.

In some embodiments, the intensity I of a projected pattern on the wafer 108 is defined by the following equations (4) and (5):

$$I(u) = \iint \mathbb{M}(\alpha)T(\alpha,\alpha')\mathbb{M}*(\alpha')e^{2\pi i(\alpha-\alpha')\cdot u}d\alpha d\alpha' \quad \text{Equation (4)}$$

$$T(\alpha,\alpha') = \int \mathbb{F}(\alpha,\alpha_s)\mathbb{F}*(\alpha',\alpha_s)d\alpha_s \quad \text{Equation (5)}$$

where $\alpha$, $\alpha_s$, and $\alpha'$ are the spatial frequency coordinates. In equation (5), $\mathbb{F}$ is a generalized pupil function that is constructed by combining the elements of the matrix $S_{2\times 2}(\alpha_s)$ of equations (1) or (2) and the elements of the matrix $P_{3\times 2}(\alpha)$ of equation (3) and $\mathbb{F}*$ is the conjugate of $\mathbb{F}$. In some embodiments, the generalized pupil function $\mathbb{F}$ is a matrix having f rows and m columns constructed from the elements of the matrices $S_{2\times 2}(\alpha_s)$ and $P_{3\times 2}(\alpha)$ and $\mathbb{F}*$ is the conjugate transpose of $\mathbb{F}$ and has m rows and f columns. Thus, $\mathbb{F}(\alpha,\alpha_s)$ $\mathbb{F}*(\alpha',\alpha_s)$ and $T(\alpha,\alpha')$ have f rows and f columns at each spatial frequency $\alpha$ and $\alpha'$. In some embodiments, the matrix of the generalized pupil function $\mathbb{F}$ has f rows and m columns, where f is the number of non-zero elements of the matrix $S_{2\times 2}(\alpha_s)$ and, thus, f is either 2 or 4. In some embodiments, m is between 3 and 6. In some embodiments, f is equal to 4 and m is equal to 6 and the matrix of the generalized pupil function $\mathbb{F}$ has 4 rows and 6 columns with a plurality of zero elements, e.g., the matrix of the generalized pupil function $\mathbb{F}$ is a sparse matrix. In some embodiments, equation (5) is represented as equation (6) below.

$$\boxed{\dfrac{P_{3\times 2}(\alpha)}{S_{2\times 2}(\alpha_s)}} \rightarrow \boxed{\mathbb{F}_{f\times m}(\alpha;\alpha_s)} \times \boxed{(\mathbb{F}*)_{m\times f}(\alpha';\alpha_s)} = \boxed{T_{f\times f}(\alpha,\alpha';\alpha_s)} \xrightarrow{\int d\alpha_s} \boxed{T_{f\times f}(\alpha,\alpha')} \quad \text{Equation (6)}$$

Equation (6)
In equation (4), $\mathbb{M}$ is the spatial Fourier transform of the layout pattern of the photo mask affecting the components in the X-direction and Y-direction as described below. $\mathbb{M}*$ is the conjugate of the spatial Fourier transform of the layout pattern of the photo mask, e.g., the spatial Fourier transform of the layout pattern of the photo mask 143 of FIG. 4 affecting the components in the X-direction and Y-direction.

In some embodiments, the Fourier transform M of the layout pattern of the photo mask, e.g., the layout pattern of the photo mask 143 of FIG. 4, at each point in the spatial frequency domain is represented by a matrix having more than one element, e.g., is represented by a 2-by-2 matrix (shown in equation (7)), to incorporate the effect of the layout pattern on the polarization components and the components of the electric or magnetic field when transmitting through the matrix. In some embodiments, the spatial Fourier transform of the layout pattern of the photo mask is written as equation (7), where at each spatial frequency $\alpha$, $M_{xx}$ and $M_{yy}$ respectively show the effect of the layout pattern M, as a multiplication factor, on the components in the X-direction and Y-direction. $M_{yx}$ shows the effect of the layout pattern M, as a multiplication factor, on the X-direction components that produce a Y-direction component. $M_{xy}$ shows the effect of the layout pattern M, as a multiplication factor, on the Y-direction components that produce an X-direction component. In some embodiments, the vector form of the layout pattern, $\mathbb{M}$, is described with equation (8), where $\mathbb{M}$ is a horizontal vector with f columns. In some embodiments, the photo mask 143 has independent polarization and x to y conversion does not occur but attenuation occurs in on y-polarization. Thus, $M_{xx}=1$, $M_{yy}=\rho$ with $|\rho|<1$, and $M_{xy}=M_{yx}=0$. In some embodiments, the photo mask 143 converts the incident x-polarization and equally generates both x-polarization and y-polarization and the incident y-polarization does not convert. Thus, $M_{xx}=\frac{1}{2}$, $M_{yx}=\frac{1}{2}$, $M_{yy}=1$, and $M_{xy}=0$. In some embodiments, f is one for the scalar modeling of light transmission, f is two when the photo mask 143 has independent polarization and x to y conversion does not occur, and f is four when x to y conversion occurs when the light passes through the photo mask 143.

$$M_{2\times 2}(\alpha) = \begin{bmatrix} M_{xx} & M_{xy} \\ M_{yx} & M_{yy} \end{bmatrix} \quad \text{Equation (7)}$$

$$\mathbb{M}_{1\times 4}(\alpha) = [M_{xx} \; M_{xy} \; M_{yx} \; M_{yy}] \quad \text{Equation (8)}$$

Thus, in some embodiments, the TCC vector-form component generator 606 receives the spatial Fourier transform S of the intensity of the illumination source 602 from the illumination source vector-form component generator 603 and also receives the exit pupil function P of the optical system, e.g., the exit pupil functions 530 and 531 of the optical systems 500 and 550, from the vector-form optical parameter generator 611. The TCC vector-form component generator 606 generates a vector-TCC operator 604. In some embodiments, an exit pupil of an optical system is a virtual aperture, e.g., a 2D surface, such that only the rays that pass through the exit pupil can exit the optical system. In some embodiments, an exit pupil function $P(\alpha)$ is a representation of the exit pupil as a function of the variable $\alpha$, where $\alpha$ is a two-dimensional (2D) variable in a 2D spatial frequency coordinate system, e.g., a 2D point $(F_x$ and $F_y)$ in a spatial frequency plane. In some embodiments, the exit pupil function is real valued represented by an amplitude that has a value of one inside a circle and a value of zero outside the circle. As shown above, the vector-TCC operator 604 depends on the exit pupil function and the illumination source distribution. In some embodiments, the exit pupil function is complex valued that is represented with an amplitude and a phase at each point of the exit pupil function, where the phase of the pupil function includes the aberrations of the optical system. The exit pupil is described above with respect to FIGS. 5A and 5B. In some embodiments, the integrand $\mathbb{P}(\alpha, \alpha_s)\mathbb{P}^*(\alpha', \alpha_s)$ of equation (5) is calculated for each spatial frequency $\alpha$, $\alpha_s$, and $\alpha'$ by matrix multiplication and the vector-TCC operator 604 is determined by numeric evaluation of the integration of equation (5), e.g., by summing the integrand of equation (5). In some embodiments, the three variables $\alpha$, $\alpha_s$, and $\alpha'$ are sampled and the sampled vector-TCC operator 604 is calculated at the sampled points of the variables $\alpha$ and $\alpha'$.

In some embodiments, the integrand of equation (4) is calculated for each one of the spatial frequencies $\alpha$ and $\alpha'$, and for the sampled points of dimension u (e.g., u is (x, y)) by matrix multiplication and the intensity I(u) of equation (4) is determined by numeric evaluation of the integration of equation (4), e.g., by summing the integrand of equation (4). In some embodiments, the vector-TCC operator 604 is symmetric and positive definite and, thus, can be expanded into separable orthogonal kernels. In some embodiments, a TCC vector-form kernel generator 608 expands the vector-TCC operator 604, with expansion coefficients $\lambda_n$, into the separable kernels $\varphi_n$ and $\varphi_n^*$. In some embodiments, the separable kernels are Eigen functions $\varphi_n$ and $\varphi_n^*$, and the vector-TCC operator 604 is expanded as shown in equation (9) below. As noted, in some embodiments, the vector-TCC operator 604 (T($\alpha$, $\alpha'$)) has f rows and f columns at each spatial frequency $\alpha$ and $\alpha'$. Thus, at each spatial frequency $\alpha$, the kernel $\varphi_n$ is a vertical vector with f rows and the kernel $\varphi_n^*$, at each spatial frequency $\alpha'$, is the conjugate transpose of the $\varphi_n$, which is a horizontal vector with f columns with elements that are the conjugate of the elements of $\varphi_n$.

$$T(\alpha, \alpha') = \Sigma_n \lambda_n \varphi_n(\alpha) \varphi_n^*(\alpha'), \lambda_n \geq 0, n=1,2,3, \qquad \text{Equation (9)}$$

Incorporating equation (9) into equation (4) the intensity I(u) of a projected pattern on the wafer 108 may be expanded as equation (10) below where $F^{-1}$ is the inverse Fourier transform operation.

$$I(u) = \Sigma_n \lambda_n |\mathcal{F}^{-1}[\mathbb{M}(\alpha)\varphi_n(\alpha)](u)|^2, \lambda_n \geq 0, n=1,2,3, \qquad \text{Equation (10)}$$

In some embodiments, the intensity I(u) of a projected pattern on the wafer 108 is approximated by a limited number, e.g., a number between 5 and 20, of the components of the equation (10). In some embodiments, as noted, each sampled spatial frequency $\alpha$ is a 2D point ($F_x$ and $F_y$) in a spatial frequency plane and the point u is a 2D point (x, y) in a space plane. In some embodiments, fast Fourier transform is used for calculating equation (10).

FIG. 6 shows a photo mask vector-form component generator 610 that provides the spatial Fourier transform M of a layout pattern of a photo mask, e.g., the photo mask 143 of FIG. 4, to the vector-TCC operator 604. The vector-TCC operator 604 generates the projected pattern 620 of the layout pattern of the photo mask 143 on the wafer 108. Alternatively, the TCC vector-form kernel generator 608 receives the spatial Fourier transform M of a layout pattern of a photo mask, e.g., the layout pattern of the photo mask 143 of FIG. 4, from the photo mask vector-form component generator 610 and generates the projected pattern 621. As noted, in some embodiments, the TCC vector-form kernel generator 608 uses a limited number of the components of the equation (9) and the projected pattern 621 is an approximation. In some embodiments, a singular value decomposition is used for defining the kernels. Thus, in the approximation, the kernels associated with the highest energy are selected so the approximation error is maintained below a threshold.

Figure 7:
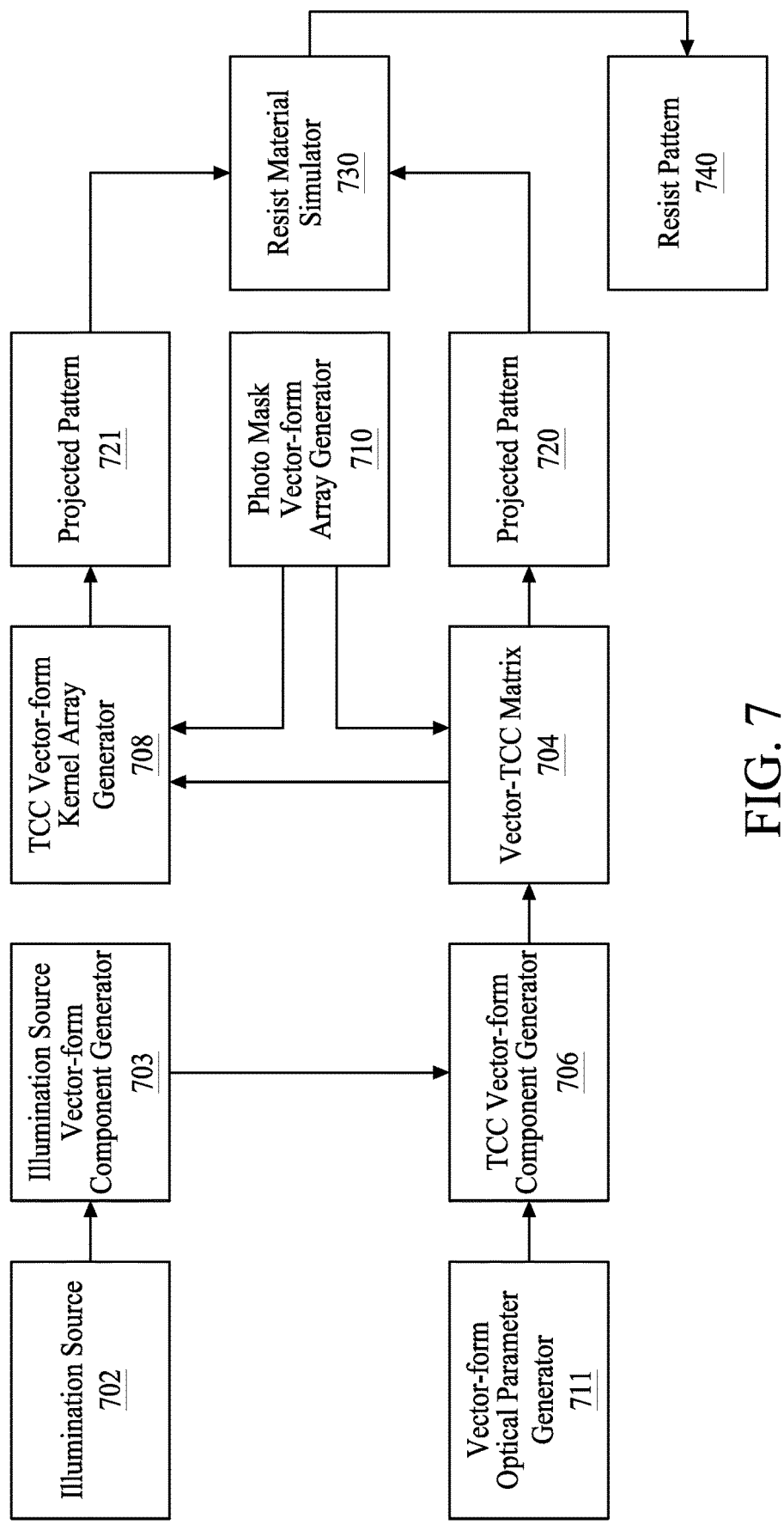
FIG. 7 illustrates a schematic diagram of an exemplary system for determining a transmission cross-coefficient (TCC) matrix and determining a projected pattern of a photo mask on a wafer.

FIG. 7 illustrates a schematic diagram of an exemplary system for determining a transmission cross-coefficient (TCC) matrix and determining a projected pattern of a photo mask on a wafer. FIG. 7 shows the illumination source 702, which is consistent with the illumination source 602 of FIG. 6. An illumination source vector-form component generator 703 of FIG. 7, which is consistent with the illumination source vector-form component generator 603, receives the information of the illumination source 702 and generates vector components of the illumination source.

FIG. 7 shows a vector-form optical parameter generator 711 consistent with the vector-form optical parameter generator 611 that generates, the optical parameters of the optical system, e.g., the exit pupil of the optical system. A TCC vector-form component generator 706, consistent with the TCC vector-form component generator 606 of FIG. 6, receives the vector-form components of the illumination source 702 and the vector-form optical parameters from the vector-form optical parameter generator 711 and generates a vector-TCC matrix 704. In some embodiments, the vector-TCC matrix 704 is the vector-TCC operator 604 that is sampled at the points $a_1, a_2, \ldots, a_n$ of the spatial frequencies $\alpha$, and $\alpha'$.

In the scalar modeling of light transmission, each point is represented by one value. In the vector representation, as described above, the extra elements provide means, e.g., degrees of freedom, for implementing the effect of different radiation components at each point and polarization components on each other. In some embodiments, the integrand of equation (4) is represented in matrix form as shown below, where the left array is a row array constructed by stacking the sampled, at spatial frequencies $a_1, a_2, \ldots, a_n$, of the transform $\mathbb{M}$ of the layout in equation (8) and the right array is a column array which is a conjugate transpose of the left array. The points $a_1, a_2, \ldots, a_n$ that are the sampled frequencies in the spatial frequency domain are described below.

| $M_{xx}(\alpha_1)$ | | | | | |
|---|---|---|---|---|---|
| $M_{xy}(\alpha_1)$ | | | | | |
| $M_{yx}(\alpha_1)$ | | | | | |
| $M_{yy}(\alpha_1)$ | $T_{4\times4}(\alpha_1, \alpha_1)$ | $\ldots$ | $T_{4\times4}(\alpha_n, \alpha_1)$ | | $M_{xx}^*(\alpha_1)$ |
| $\vdots$ | $\vdots$ | $\ddots$ | $\vdots$ | $\otimes$ | $M_{xy}^*(\alpha_1)$ |
| $M_{xx}(\alpha_n)$ | $T_{4\times4}(\alpha_n, \alpha_1)$ | $\ldots$ | $T_{4\times4}(\alpha_n, \alpha_c)$ | | $M_{yx}^*(\alpha_1)$ |
| $M_{xy}(\alpha_n)$ | | | | | $M_{yy}^*(\alpha_1)$ |
| $M_{yx}(\alpha_n)$ | | | | | $\vdots$ |
| $M_{yy}(\alpha_n)$ | | | | | $M_{xx}^*(\alpha_n)$ |
| | | | | | $M_{xy}^*(\alpha_n)$ |
| | | | | | $M_{yx}^*(\alpha_n)$ |
| | | | | | $M_{yy}^*(\alpha_n)$ |

As shown above), the matrix between the arrays on the right and left side is the vector-TCC matrix 704, which includes f by f (e.g., 4 by 4) blocks (e.g., sampled T matrices) that are constructed according to equation (6) and the outcome of equation (6) is sampled at spatial frequencies $a_1, a_2, \ldots, a_n$. Thus, the vector-TCC matrix 704 has n by n blocks of f by f matrices. In some embodiments, f is 2 and the spatial Fourier transform $\mathbb{M}$ of the layout pattern of the photo mask includes $M_{xx}$ and $M_{yy}$. Equation (4) can be represented in matrix form as shown below, where the points $a_1, a_2, \ldots, a_n$ are the sampled frequencies in the spatial frequency domain.

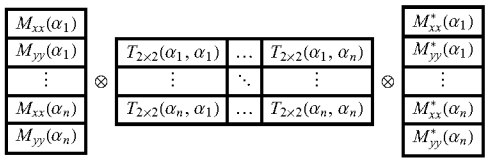

Figure 12:
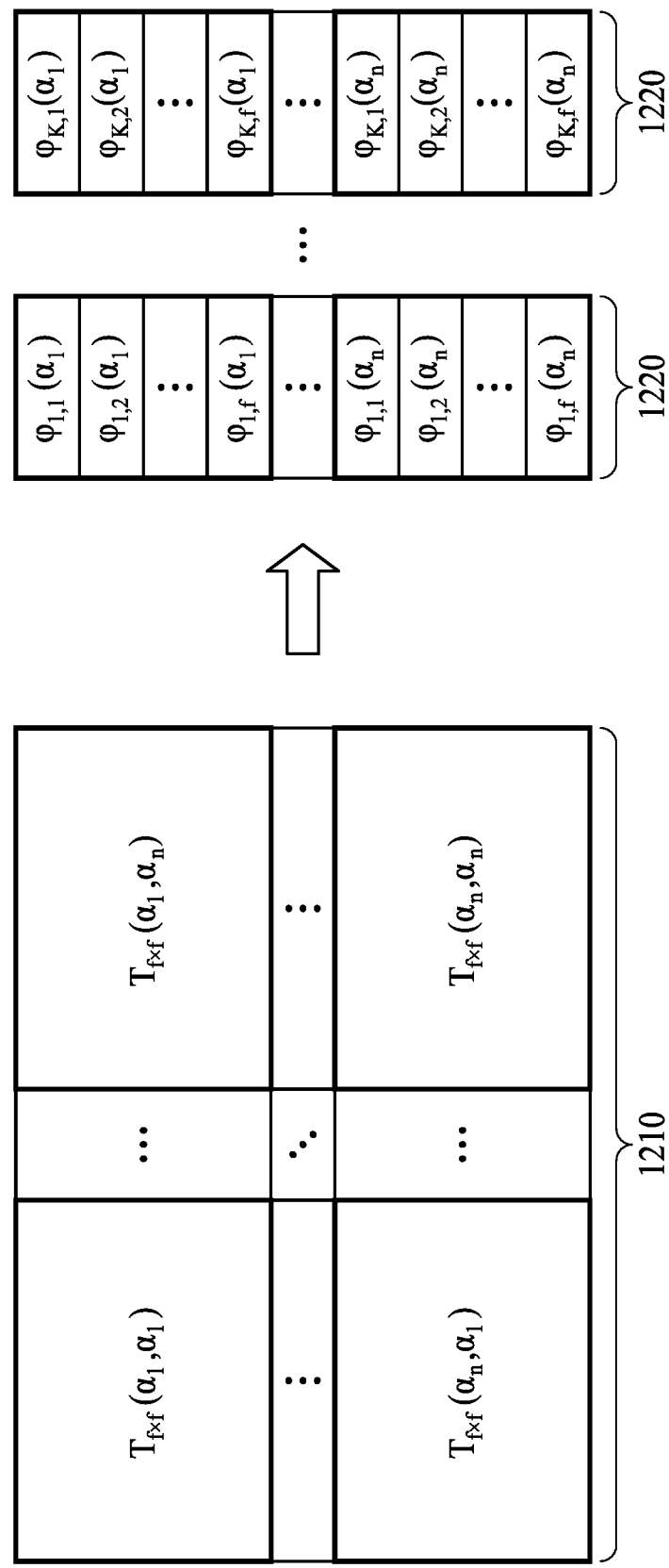
FIG. 12 illustrates expanding a TCC matrix into a plurality of arrays in accordance with some embodiments of the disclosure.

In some embodiments, as shown in FIG. 7, the TCC vector-form kernel array generator 708 expands the vector-TCC matrix 704, with expansion coefficients $\lambda_n$, into a matrix space as described with respect to FIG. 12. In addition, FIG. 7 shows a photo mask vector-form array generator 710 that provides the spatial Fourier transform $\mathbb{M}$ of a layout pattern of a photo mask, e.g., the layout pattern of the photo mask 143 of FIG. 4, to the vector-TCC matrix 704. The vector-TCC matrix 704 generates the projected pattern 720 of the layout pattern of the photo mask 143 on the wafer 108. Alternatively, the TCC vector-form array generator 708 receives the spatial Fourier transform $\mathbb{M}$ of a layout pattern of a photo mask, e.g., the layout pattern of the photo mask 143 of FIG. 4, from the photo mask vector-form array generator 710 and generates the projected pattern 721. In some embodiments, the resist material simulator 730 receives one of the projected patterns 721 or 720 and generates a resist pattern 740 of the wafer.

Figure 8:
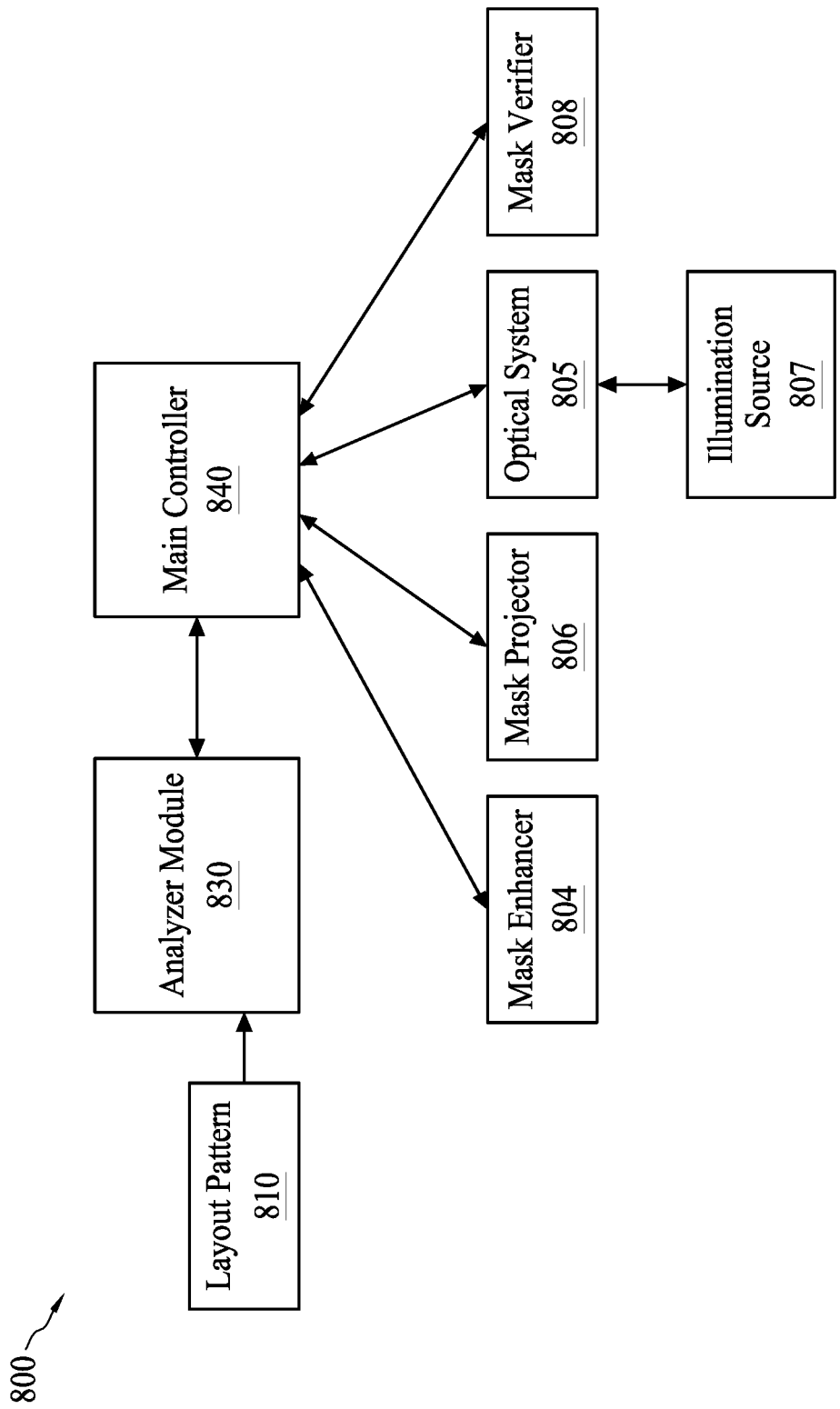
FIG. 8 illustrates an exemplary system of enhancing a photo mask in accordance with some embodiments of the disclosure.

FIG. 8 illustrates an exemplary system 800 of enhancing a photo mask in accordance with some embodiments of the disclosure. The system 800 includes an analyzer module 830 and a main controller 840 coupled to each other. The analyzer module 830 receives the layout pattern 810, which is consistent with the target layout pattern M of FIGS. 1 and 2A. The analyzer module 830 may send the layout pattern 810 to a mask enhancer 804 that is coupled to the main controller 840. In some embodiments, the analyzer module 830 determines the resolution of the numerical calculations for determining equations (4) and (5) and determining the TCC matrix. In some embodiments, the analyzer module 830 determines the number of sampling points and the location of the sampling points of the illumination source 807 on the illumination source profile. The location of the sampling points may be uniformly distributed on the intensity or amplitude profile of the illumination source 807. The main controller 840 is also coupled to a mask projector 806, consistent with mask projector 130 of FIGS. 1 and 2A, an optical system 805, and a mask verifier 808. The optical system 805 is consistent with the optical systems 500 and 550 of FIGS. 5A and 5B and the mask verifier 808 is consistent with the OPC verifier 140 of FIG. 2A or the ILT verifier 456 of FIG. 4. The illumination source 807 is consistent with the illumination source 502 or the illumination source 522 of FIGS. 5A and 5B.

In some embodiments, the mask enhancer 804 performs the OPC or ILT operations on the layout pattern 810. In some embodiments, instead of the mask enhancer 804, the analyzer module 830 performs the OPC or ILT operations on the layout pattern 810. In some embodiments, the mask enhancer 804 or the analyzer module 830 determines the vector-TCC operator or the vector-TCC matrix, e.g., the vector-TCC operator 604 of FIG. 6 or the vector-TCC matrix 704 of FIG. 7, which are incorporated into the optical system 805 of a lithographic system. In some embodiments, the optical system 805 is consistent with the optical systems 500 and 550 of FIGS. 5A and 5B. In some embodiments, the mask enhancer 804 or the analyzer module 830 determines the vector-TCC operator or the vector-TCC matrix, e.g., the vector-TCC operator 604 of FIG. 6 or the vector-TCC matrix 704 of FIG. 7, of the optical system 805 of the lithographic system based on an illumination source, e.g., illumination source 502 of FIG. 5A or 5B or illumination source 807 of FIG. 8. The mask enhancer 804 or the analyzer module 830 also determines the vector-TCC operator 604 or the sampled version, the vector-TCC matrix 704, of the optical system 805 or of the optical systems 500 and 550 of FIGS. 5A and 5B based on the illumination source 502 and the illumination source 522. In some embodiments, the mask enhancer 804 or the analyzer module 830 determines the vector-TCC operator 604 or the vector-TCC matrix 704 based on the exit pupil, e.g., the exit pupil 530 and 531 of the optical systems 500 and 550 as described in equation (5) or equation (9).

As shown in the system 800, the mask enhancer 804 is coupled to the analyzer module 830 through the main controller 840. In some embodiments, the mask enhancer 804 is consistent with the OPC enhancer 122 of FIG. 2A. The system 800 also includes a mask projector 806 that is coupled to the analyzer module 830 through the main controller 840. In some embodiments, the mask projector 806 is consistent with the mask projector 130 of FIGS. 2A and 4. The system 800 further includes a mask verifier 808 that is coupled to the analyzer module 830 through the main controller 840. In some embodiments, the mask verifier 808 is consistent with the OPC verifier 140 of FIG. 2A. In some embodiments, the mask enhancer 804, the mask projector 806, and the mask verifier 808 are included in the main controller 840.

In some embodiments, the mask enhancer 804 or the analyzer module 830 implements the illumination source vector-form component generator 603, the TCC vector-form component generator 606, the vector-form optical parameter generator 611, the TCC vector-form kernel generator 608, and the photo mask vector-form component generator 610 of FIG. 6. In some embodiments, the mask projector 806 provides the projected patterns 620 and 621 of FIG. 6. In some embodiments, the mask enhancer 804 or the analyzer module 830 implements the illumination source vector-form component generator 703, the vector-form optical parameter generator 711, the TCC vector-form component generator 706, the TCC vector-form kernel array generator 708, the photo mask vector-form array generator 710, and the resist material simulator 730 of FIG. 7. In some embodiments, the mask projector 806 provides the projected patterns 720 and 721 of FIG. 7.

Figure 9:
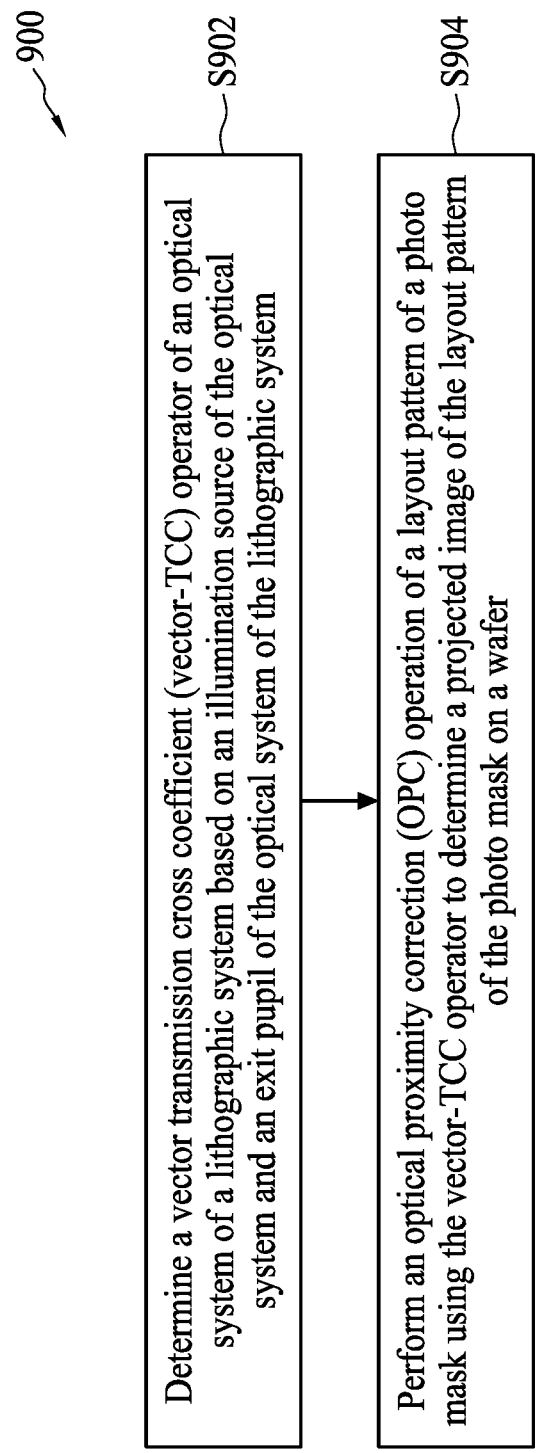
FIG. 9 illustrates a flow diagram of an exemplary process for enhancing a photo mask in accordance with some embodiments of the disclosure.

FIG. 9 illustrates a flow diagram of an exemplary process for enhancing a photo mask in accordance with some embodiments of the disclosure. The process 900 may be performed by the system of FIGS. 2A and 8. In some embodiments, the process 900 or a portion of the process 900 is performed and/or is controlled by the computer system 1000 described below with respect to FIGS. 10A and 10B. In some embodiments, the process 900 is performed by the system 800 of FIG. 8. The method includes an operation S902 of determining a vector transmission cross coefficient (vector-TCC) operator of an optical system of a lithographic system based on an illumination source of the optical system and an exit pupil of the optical system of the lithographic system. In some embodiments, the vector-TCC operator 604 of FIG. 6 is produced based on the illumination source 502 of FIGS. 5A and 5B, e.g., the input source. In some embodiments, determining the vector-TCC operator 604 of FIG. 6 includes determining a cross section between two overlapping exit pupil functions having different offsets as shown in equation (5) and FIG. 11B described below. As discussed above, the exit pupil function P at each spatial frequency is matrix valued. Thus, the cross section between two overlapping exit pupil functions is determined between corresponding elements of the matrix.

In operation S904, an optical proximity correction (OPC) operation of a layout pattern of a photo mask is performed using the vector-TCC operator to determine a projected pattern of the layout pattern of the photo mask on a wafer. As shown, the OPC operation may be performed as shown in FIG. 2A and the mask projector 130 uses the vector-TCC operator to determine the projected resist pattern 101.

Figure 10A:
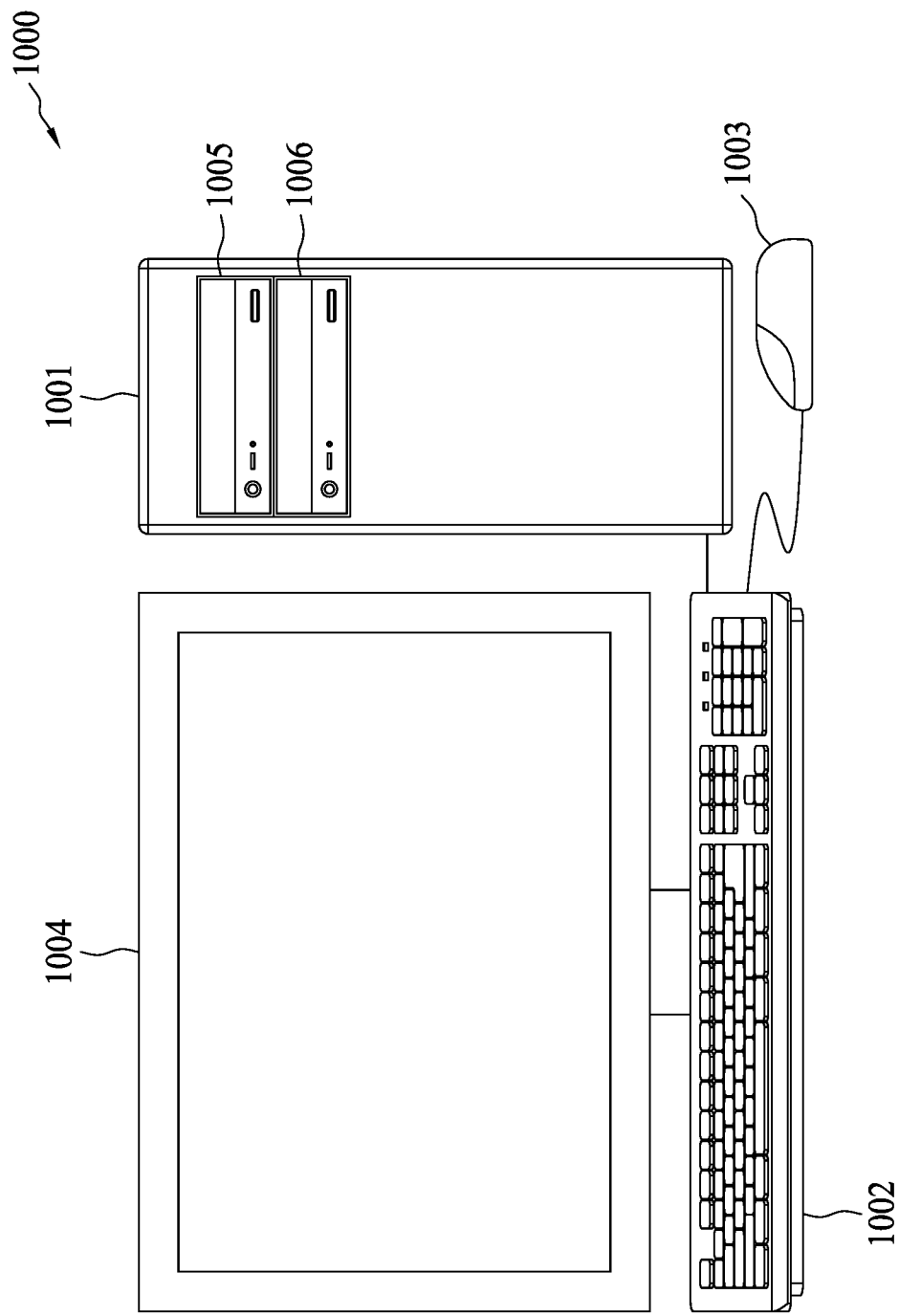
FIGS. 10A and 10B illustrate an apparatus for enhancing a photo mask in accordance with some embodiments of the disclosure.
Figure 10B:
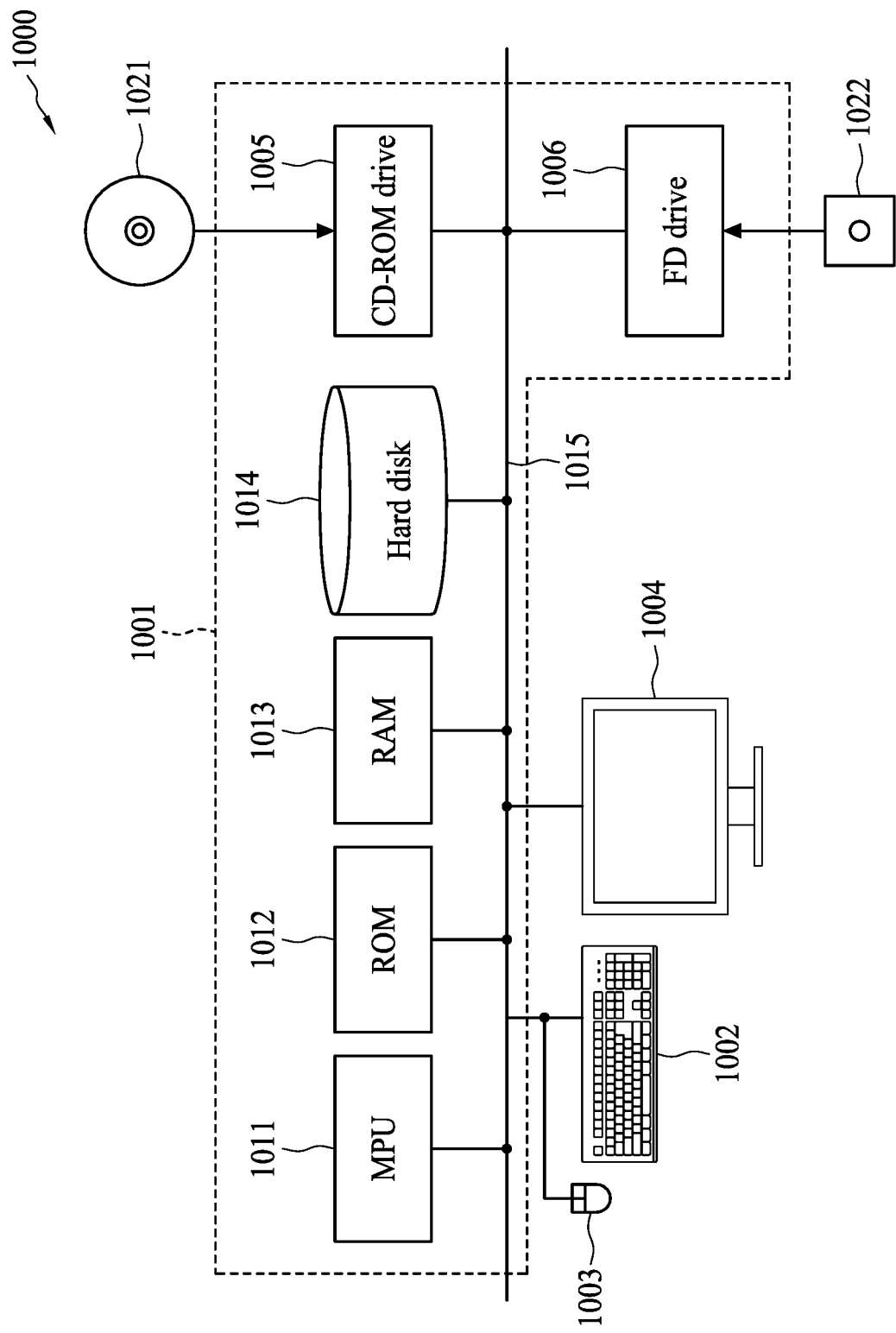

FIGS. 10A and 10B illustrate an apparatus for enhancing a photo mask in accordance with some embodiments of the disclosure. In some embodiments, the computer system 1000 is used for enhancing a photo mask. Thus, in some embodiments, the computer system 1000 performs the functions of the OPC enhancer 122, the mask projector 130, and the OPC verifier 140 of FIG. 2A. In some embodiments, as described in FIG. 8, the computer system 1000 performs the functions of the analyzer module 830, main controller 840, the mask enhancer 804, the mask projector 806, the optical system 805, and the mask verifier 808. FIG. 10A is a schematic view of a computer system that performs the enhancing of a photo mask. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions of an apparatus for performing the enhancement of a photo mask in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the photo mask enhancement apparatus in the foregoing embodiments. The program may only include a command portion to call an appropriate function (module) in a controlled mode and obtain desired results.

Figure 11B:
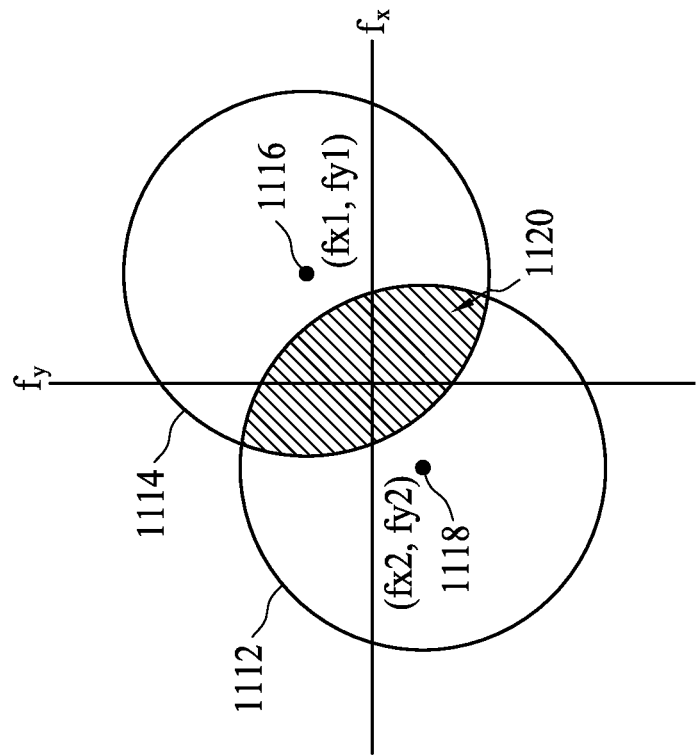
FIGS. 11A and 11B respectively illustrate an exit pupil function of an optical system with no offset and two exit pupil functions of the optical system having different offsets in accordance with some embodiments of the disclosure.
Figure 11A:
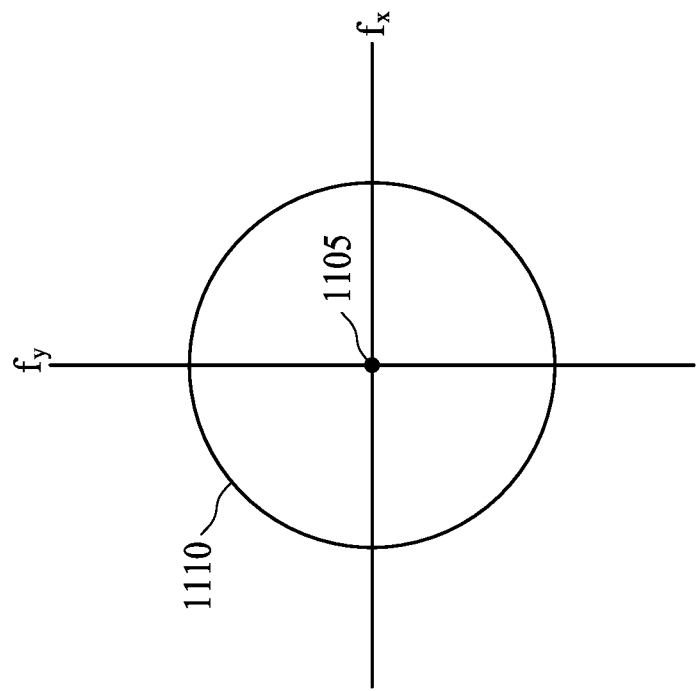

FIGS. 11A and 11B respectively illustrate an exit pupil function of an optical system with no offset and two exit pupil functions of the optical system having different offsets in accordance with some embodiments of the disclosure. As discussed above, the exit pupil function P at each spatial frequency is matrix valued. Thus, the exit pupil function of the optical system with no offset and the two exit pupil functions of the optical system having different offsets is determined between corresponding elements of the matrix. Thus, the following corresponds to one matrix element of the exit pupil function. FIG. 11A shows an exit pupil function 1110 having the shape of a circle and centered at the origin (0,0), which is origin 1105. The exit pupil function 1110 is consistent with the shape of the exit pupil 530 and 531 of the optical systems 500 and 550 of FIGS. 5A and 5B. In some embodiments, the exit pupil 530 of the optical system 500 or the exit pupil 531 of the optical system 550 has a shape of a lens of the objective lens system 506 and thus is represented by a circular exit pupil function such that inside circle is unity and outside the circle is zero. In some embodiments, the optical system, e.g., the optical system 500 or 550, includes optical aberrations and the optical aberrations of the optical system 500 or 550 is represented as additional phases of the exit pupil function P such that inside the circle the exit pupil function P has a complex value and in addition to the unity amplitude has a varying phase.

FIG. 11B shows two overlapping exit pupil functions 1112 and 1114 having different offsets 1116 and 1118 in a spatial frequency coordinate system $\alpha_s=(F_x, F_y)$. The two overlapping exit pupil functions 1112 and 1114 are consistent with the overlapping of the exit pupil functions P and its conjugate P* in equations (5) and (6) and the offset 1116, e.g., $(F_{x1}, F_{y1})$, and the offset 1118, e.g., $(F_{x2}, F_{y2})$, are consistent with the offsets $\alpha$ and $\alpha'$ of equations (5) and (6). Thus, the overlapping area 1120, e.g., the shaded area, of FIG. 11B is the area in equations (5) and (6) where the spatial Fourier transform S of the illumination source is evaluated. In some embodiments, the illumination source in equation (6) is an incoherent illumination source and the spatial Fourier transform S is the spatial Fourier transform of the intensity of the illumination source and equation (4) determines the light intensity on a resist layer on the wafer.

In some embodiments, when the illumination source is partially coherent, determining the vector-TCC operator 604 of FIG. 6 or determining the vector-TCC matrix 704 of FIG. 7 includes determining a cross-section area between the two overlapping exit pupil functions 1112 and 1114 and a circle centered at the origin 1105 and having a radius equal to a coherent length of the illumination source (not shown) and evaluating the spatial Fourier transform S in the cross-section area.

FIG. 12 illustrates expanding a TCC matrix 1210 into a plurality of arrays 1220 in accordance with some embodiments of the disclosure as described in equation (9). As described, in some embodiments, the TCC matrix 1210 is expanded as a weighted sum of the product of each array 1220 with a conjugate transpose of the same array 1220.

In some embodiments, implementing the processes and methods mentioned above, adapts the target layout pattern to a modified target layout pattern by using projection simulation. The projection simulation uses a vector model for the transmission of the illumination radiation from the illumination source to the wafer and the TCC matrix includes elements that incorporate the polarization components or the components of the electric or magnetic field. Therefore, the described methods above provide an accurate simulated projection.

According to some embodiments of the present disclosure, a method of enhancing a layout pattern includes determining a vector transmission cross coefficient (vector- TCC) operator of an optical system of a lithographic system based on an illumination source of the optical system and an exit pupil of the optical system of the lithographic system. The method further includes performing an optical proximity correction (OPC) operation of a layout pattern of a photo mask to generate an OPC corrected layout pattern. The OPC operation uses the vector-TCC operator to determine a projected pattern of the layout pattern of the photo mask on a wafer. In an embodiment, the layout pattern of the photo mask includes one or more specific features, and using the vector-TCC operator to determine the projected pattern of the layout pattern generates the one or more specific features on a resist layer on the wafer. In an embodiment, the vector-TCC operator implements a vector representation for radiation of the illumination source, and the vector-TCC operator implements a vector representation for transmission of the radiation of the illumination source in the optical system of the lithographic system. In an embodiment, a numerical aperture (NA) of the optical system of the lithographic system is between 0.5 and 0.9. In an embodiment, the method further includes receiving an illumination profile of the illumination source and an exit pupil function of the optical system and sampling the illumination profile of the illumination source and the exit pupil function of the optical system, numerically determining the vector-TCC operator based on the sampled illumination profile of the illumination source and a sampled exit pupil function of the optical system, and numerically determining the projected pattern of the layout pattern of the photo mask on the wafer in the OPC operation. And after the determining the projected pattern receiving information of a photo resist material deposited on the wafer, and numerically determining a photo resist pattern developed on the wafer based on the received information of the photo resist material and the determined projected image. In an embodiment, the illumination profile is one of an amplitude profile or an intensity profile for each polarization component of the illumination source, the method further includes sampling the layout pattern of the photo mask before numerically determining the projected pattern on the wafer. In an embodiment, the method further includes producing the OPC corrected layout pattern on a mask blank to create a photo mask.

According to some embodiments of the present disclosure, a method of enhancing a layout pattern includes determining a vector transmission cross coefficient (vector-TCC) matrix of an optical system of a lithographic system based on an illumination source of the optical system and an exit pupil function of the optical system of the lithographic system. The method also includes performing an optical proximity correction (OPC) operation of a layout pattern of a photo mask. The OPC operation uses the vector-TCC matrix to determine a projected pattern of the layout pattern of the photo mask on a wafer. The method further includes performing an inverse lithographic transformation (ILT) operation of the layout pattern to generate an enhanced layout pattern. The ILT operation uses the vector-TCC matrix to determine a projected pattern of the layout pattern of the photo mask on the wafer during the ILT operation. The method includes producing the ILT enhanced layout pattern on a mask-blank to create a photo mask. In an embodiment, the method further includes representing the vector-TCC matrix in a kernel space. A plurality of orthogonal first kernels spans the kernel space. In an embodiment, the plurality of orthogonal first kernels are a plurality of orthogonal first arrays having vector components. The vector-TCC matrix is represented as a weighted sum of a plurality of matrices generated as products of each one of the orthogonal first arrays, in column form, multiplied by a transpose of the array. In an embodiment, the transpose of the array is a conjugate transpose of the array, the method further includes approximating the vector-TCC matrix by using two or more first arrays of the plurality of first arrays, and using the approximated vector-TCC matrix to determine the projected pattern of the layout pattern of the photo mask on the wafer. In an embodiment, the method further includes receiving an illumination profile of the illumination source and the exit pupil function of the optical system and sampling the illumination profile of the illumination source and the exit pupil function of the optical system, and determining the vector-TCC matrix based on the sampled illumination profile of the illumination source. In an embodiment, the method further includes prior to the performing the ILT operation of the layout pattern, using the determined vector-TCC matrix to determine the projected pattern of the layout pattern of the photo mask on the wafer for performing an optical proximity correction (OPC) operation of the layout pattern. In an embodiment, the method further includes receiving another layout pattern of the photo mask of the lithographic system, and performing the ILT operation of the other layout pattern using the vector-TCC matrix to determine a projected pattern of the other layout pattern of the photo mask on the wafer.

According to some embodiments of the present disclosure, a lithographic system includes a main controller, a photo mask, and a mask enhancer coupled to the main controller. The system also includes an optical system that includes an illumination source. The optical system is coupled to the main controller. The system includes a mask projector coupled to the main controller and the mask enhancer that produces a projection of the photo mask on a wafer. The system further includes an analyzer module coupled to the main controller. The analyzer module receives a target layout pattern to be produced on the wafer. The mask enhancer is coupled to the analyzer module through the main controller and receives the target layout pattern from the analyzer module to perform one of an optical proximity correction (OPC) operation or an inverse lithographic transformation (ILT) operation of the target layout pattern. The mask enhancer is configured to determine a vector transmission cross coefficient (vector-TCC) operator of the optical system of the lithographic system based on the illumination source of the optical system and an exit pupil of the optical system of the lithographic system. The mask projector performs the projection of a photo mask on the wafer for the OPC operation or the ILT operation using the vector-TCC operator to determine a projected pattern of the layout pattern of the photo mask on the wafer. In an embodiment, the illumination source is a laser source, and the optical system has a numerical aperture (NA) between 0.5 and 0.9. In an embodiment, the illumination source is one of a coherent source or a partially coherent source. In an embodiment, a profile of the illumination source is a circular profile having a radius between 0.5 cm and 5 cm and having a constant amplitude. In an embodiment, the illumination source is one of a deep ultraviolet or an extreme ultraviolet illumination source.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
combining first elements of an illumination profile of an illumination source of an optical system of a lithographic system and second elements of an exit pupil function of the optical system to form a generalized pupil function;
determining a vector transmission cross coefficient (vector-TCC) operator of the optical system of the lithographic system based on a product of the generalized pupil function and a conjugate of the generalized pupil function; and
performing an optical proximity correction (OPC) operation of a layout pattern of a photo mask to generate an OPC corrected layout pattern, wherein the OPC operation uses the vector-TCC operator to determine a projected pattern of the layout pattern of the photo mask on a wafer.

2. The method of claim 1, wherein the vector-TCC operator implements a vector representation for radiation of the illumination source, and wherein the vector-TCC operator implements a vector representation for transmission of the radiation of the illumination source in the optical system of the lithographic system.

3. The method of claim 1, further comprising prior to the determining the vector-TCC operator:
receiving the illumination profile of the illumination source and the exit pupil function of the optical system and sampling the illumination profile of the illumination source and the exit pupil function of the optical system;
numerically determining the vector-TCC operator based on the sampled illumination profile of the illumination source and the sampled exit pupil function of the optical system; and
numerically determining the projected pattern of the layout pattern of the photo mask on the wafer in the OPC operation; and
after the determining the projected pattern:
receiving information of a photo resist material deposited on the wafer; and
numerically determining a photo resist pattern developed on the wafer based on the received information of the photo resist material and the determined projected pattern.

4. The method of claim 3, wherein the illumination profile of the illumination source is one of an amplitude profile or an intensity profile for each polarization component of the illumination source, the method further comprising:
sampling the layout pattern of the photo mask before numerically determining the projected pattern on the wafer.

5. The method of claim 1, further comprising:
producing the OPC corrected layout pattern on a mask blank to create a photo mask.

6. The method of claim 1, wherein the exit pupil function of the optical system of the lithographic system is complex valued and comprises aberration of the optical system of the lithographic system, and wherein the generalized pupil function is complex valued.

7. The method of claim 1, wherein the vector-TCC operator is symmetric and positive definite, and wherein the vector-TCC operator is a weighted sum of two or more separable orthogonal kernels.

8. A method comprising:
combining first elements of an illumination profile of an illumination source of an optical system of a lithographic system and second elements of an exit pupil function of the optical system to form a generalized pupil function;
determining a vector transmission cross coefficient (vector-TCC) matrix of the optical system of the lithographic system based on the generalized pupil function;
performing an optical proximity correction (OPC) operation of a layout pattern of a photo mask, wherein the OPC operation uses the vector-TCC matrix to determine a projected pattern of the layout pattern of the photo mask on a wafer;
performing an inverse lithographic transformation (ILT) operation of the layout pattern to generate an enhanced layout pattern, wherein the ILT operation uses the vector-TCC matrix to determine a projected pattern of the layout pattern of the photo mask on the wafer during the ILT operation; and
producing the ILT enhanced layout pattern on a mask-blank to create a photo mask.

9. The method of claim 8, further comprising:
representing the vector-TCC matrix in a kernel space, wherein a plurality of orthogonal first kernels spans the kernel space.

10. The method of claim 9, wherein the plurality of orthogonal first kernels are a plurality of orthogonal first arrays having vector components, wherein the vector-TCC matrix is represented as a weighted sum of a plurality of matrices generated as products of each one of the orthogonal first arrays, in column form, multiplied by a transpose of the orthogonal first array.

11. The method of claim 10, wherein the transpose of the orthogonal first array is a conjugate transpose of the orthogonal first array, and the method further comprises:
approximating the vector-TCC matrix by using two or more first arrays of the plurality of orthogonal first arrays; and
using the approximated vector-TCC matrix to determine the projected pattern of the layout pattern of the photo mask on the wafer.

12. The method of claim 8, further comprising:
receiving the illumination profile of the illumination source and the exit pupil function of the optical system and sampling the illumination profile of the illumination source and the exit pupil function of the optical system; and
determining the vector-TCC matrix based on the sampled illumination profile of the illumination source.

13. The method of claim 12, further comprising, prior to the performing the ILT operation of the layout pattern,
using the determined vector-TCC matrix to determine the projected pattern of the layout pattern of the photo mask on the wafer for performing an optical proximity correction (OPC) operation of the layout pattern.

14. The method of claim 8, wherein the generalized pupil function is a sparse matrix.

15. A lithographic system, comprising:
a main controller;
a photo mask;
a mask enhancer coupled to the main controller;

an optical system comprising an illumination source, wherein the optical system is coupled to the main controller;

a mask projector coupled to the main controller and the mask enhancer and configured to produce a projection of the photo mask on a wafer; and an analyzer module coupled to the main controller, wherein the analyzer module is configured to receive a target layout pattern to be produced on the wafer, wherein the mask enhancer is coupled to the analyzer module through the main controller and is configured to receive the target layout pattern from the analyzer module and to perform one of an optical proximity correction (OPC) operation or an inverse lithographic transformation (ILT) operation of the target layout pattern, wherein the mask enhancer is configured to:
combine first elements of an illumination profile of an illumination source of an optical system of a lithographic system and second elements of an exit pupil function of the optical system to form a generalized pupil function; and determine a vector transmission cross coefficient (vector-TCC) operator of the optical system of the lithographic system based on the generalized pupil function and a conjugate of the generalized pupil function, wherein the mask projector is configured to perform the projection of a photo mask on the wafer for the OPC operation or the ILT operation using the vector-TCC operator to determine a projected pattern of the photo mask on the wafer.

16. The lithographic system of claim 15, wherein the illumination source is one of a coherent source or a partially coherent source.

17. The lithographic system of claim 15, wherein the illumination profile of the illumination source is a circular profile having a radius between 0.5 cm and 5 cm and having a constant amplitude.

18. The lithographic system of claim 15, wherein the illumination profile of the illumination source is a Gaussian profile with a standard deviation between 0.5 cm and 5 cm.

19. The lithographic system of claim 15, wherein the illumination source is one of a deep ultraviolet or an extreme ultraviolet illumination source.

20. The lithographic system of claim 15, wherein the vector-TCC operator is symmetric and positive definite, and wherein the vector-TCC operator is a weighted sum of two or more eigen functions of the vector-TCC operator.

* * * * *